United States Patent
Lee et al.

(10) Patent No.: US 11,476,257 B2
(45) Date of Patent: Oct. 18, 2022

(54) INTEGRATED CIRCUIT INCLUDING MEMORY CELL AND METHOD OF DESIGNING THE SAME

(71) Applicant: SAMSUNG ELECTRONICS CO., LTD., Suwon-si (KR)

(72) Inventors: Inhak Lee, Seoul (KR); Seunghun Lee, Hwaseong-si (KR); Sangyeop Baeck, Yongin-si (KR); Seunghan Park, Gunpo-si (KR); Hyejin Lee, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/371,522

(22) Filed: Jul. 9, 2021

(65) Prior Publication Data
US 2022/0037339 A1    Feb. 3, 2022

(30) Foreign Application Priority Data

Jul. 31, 2020  (KR) .................. 10-2020-0096117
Mar. 10, 2021  (KR) .................. 10-2021-0031462

(51) Int. Cl.
G11C 5/06    (2006.01)
H01L 27/11   (2006.01)
G11C 11/417  (2006.01)
G11C 11/412  (2006.01)

(52) U.S. Cl.
CPC .......... *H01L 27/1104* (2013.01); *G11C 5/063* (2013.01); *G11C 11/412* (2013.01); *G11C 11/417* (2013.01)

(58) Field of Classification Search
CPC ... H01L 27/1104; G11C 5/063; G11C 11/412; G11C 11/417
USPC ........................................... 365/63
See application file for complete search history.

(56) References Cited

U.S. PATENT DOCUMENTS

| 7,646,052 B2* | 1/2010 | Nagata ................. | H01L 27/105 257/296 |
| 8,254,153 B2* | 8/2012 | Dono ...................... | G11C 5/02 365/189.08 |
| 8,350,389 B2* | 1/2013 | Itaya ....................... | H01L 24/11 257/774 |

(Continued)

FOREIGN PATENT DOCUMENTS

| CN | 110299344 A | * 10/2019 | .......... H01L 23/522 |
| CN | 113451256 A | *  9/2021 | ....... H01L 21/76895 |

(Continued)

*Primary Examiner* — Viet Q Nguyen
(74) *Attorney, Agent, or Firm* — Sughrue Mion, PLLC

(57) ABSTRACT

An integrated circuit includes: a first wiring layer on which a first bit line pattern and a positive power supply pattern, a first power supply line landing pad, and a first word line landing pad are formed; a second wiring layer on which a first negative power supply pattern connected to the first power supply line landing pad, and a first word line pattern connected to the first word line landing pad are formed; a third wiring layer on which a second negative power supply pattern connected to the first negative power supply pattern, and a second word line landing pad connected to the first word line pattern are formed; and a fourth wiring layer on which a second word line pattern, connected to the second word line landing pad, are formed.

20 Claims, 26 Drawing Sheets

(56) References Cited

U.S. PATENT DOCUMENTS

| | | |
|---|---|---|
| 8,830,732 B2 | 9/2014 | Liaw |
| 9,337,139 B2 * | 5/2016 | Kitano .................... G11C 5/04 |
| 9,595,563 B2 * | 3/2017 | Ito ........................ H01L 45/1675 |
| 9,640,462 B2 * | 5/2017 | Wada ...................... H01L 24/05 |
| 9,990,981 B2 * | 6/2018 | Suwa ............... H01L 23/49816 |
| 10,043,966 B2 * | 8/2018 | Bak ......................... H01L 43/10 |
| 10,128,253 B2 | 11/2018 | Liaw |
| 10,490,261 B2 | 11/2019 | Liaw |
| 10,607,981 B2 | 3/2020 | Yeh et al. |
| 10,748,915 B2 * | 8/2020 | Nojima ............. H01L 27/11575 |
| 11,004,521 B2 * | 5/2021 | Suematsu .............. G11C 16/30 |
| 11,309,246 B2 * | 4/2022 | Dabral ................ H01L 23/5389 |
| 2009/0040802 A1 * | 2/2009 | Arakawa ............ G11C 13/0028 |
| | | 365/158 |
| 2012/0056298 A1 * | 3/2012 | Kuroki ............... H01L 23/5223 |
| | | 257/532 |
| 2014/0299941 A1 | 10/2014 | Paul |
| 2019/0006370 A1 | 1/2019 | Huang et al. |
| 2019/0279990 A1 | 9/2019 | Paul et al. |

FOREIGN PATENT DOCUMENTS

| | | | | |
|---|---|---|---|---|
| CN | 114121082 A | * | 3/2022 | ......... G11C 11/4076 |
| TW | 202145230 A | * | 12/2021 | |

\* cited by examiner

INTEGRATED CIRCUIT INCLUDING MEMORY CELL AND METHOD OF DESIGNING THE SAME

CROSS-REFERENCE TO RELATED APPLICATIONS

This application is based on and claims priority from Korean Patent Application Nos. 10-2020-0096117, filed on Jul. 31, 2020, and 10-2021-0031462, filed on Mar. 10, 2021, in the Korean Intellectual Property Office, the disclosures of which are incorporated by reference herein in their entirety.

BACKGROUND

The disclosure relates to an integrated circuit, and more particularly, to an integrated circuit including a memory cell.

Due to the demand for high degree of integration of integrated circuits and the development of semiconductor processes, the widths, intervals, and/or heights of lines included in an integrated circuit may decrease, and parasitic elements and resistance of the lines may increase. Accordingly, a driving characteristic of a path providing a voltage to a standard cell included in an integrated circuit may be deteriorated. In addition, a power supply voltage of the integrated circuit may be reduced for reduced power consumption, high operating speed, or the like, and accordingly, the effect of parasitic elements and resistance of the lines on the integrated circuit may become more significant. In spite of the parasitic elements and resistance, a memory device manufactured by a semiconductor manufacturing process is still required to stably provide high performance according to requirements of various applications.

SUMMARY

The example embodiment of the inventive concept relates to an integrated circuit, and provides an integrated circuit that stably supplies a voltage to a memory cell.

According to example embodiments, there is provided an integrated circuit including a plurality memory cells. The integrated circuit may include a first wiring layer including: a first bit line pattern and a positive power supply pattern extending in a first direction, the positive power supply pattern being configured to provide a positive supply voltage; and a plurality of first power supply line landing pads configured to provide a negative supply voltage, and a plurality of first word line landing pads configured to provide a word line voltage. The integrated circuit may further include a second wiring layer including: a first negative power supply pattern extending in a second direction, and connecting first power supply line landing pads, which are adjacent to each other in the second direction among the plurality of first power supply line landing pads, to each other, and configured to provide the negative supply voltage; and a plurality of first word line patterns extending in the second direction, connected to the plurality of first word line landing pads, and configured to provide the word line voltage. The integrated circuit may also include a third wiring layer including: a second negative power supply pattern connected to the first negative power supply pattern; and a plurality of second word line landing pads connected to the plurality of first word line patterns. The integrated circuit may further include a fourth wiring layer including: a plurality of second word line patterns extending in the second direction, connected to the plurality of second word line landing pads, and configured to provide the word line voltage.

According to example embodiments, there is provided an integrated circuit including a plurality memory cells. The integrated circuit may include a bit line structure including: a first bit line pattern formed on a first wiring layer, configured to provide a bit line voltage to the memory cells, and extending in a first direction. The integrated circuit may further include a word line structure including: a plurality of first word line landing pads formed on the first wiring layer, and configured to provide a word line voltage to the memory cells; a plurality of first word line patterns formed on a second wiring layer, extending in a second direction perpendicular to the first direction, and connected to the plurality of first word line landing pads; a plurality of second word line landing pads formed on a third wiring layer and connected to the plurality of first word line patterns; and a plurality of second word line patterns formed on a fourth wiring layer, extending in the second direction, and connected to the plurality of second word line landing pads. The integrated circuit may also include a negative power supply line structure including: a plurality of first power supply line landing pads formed on the first wiring layer, and configured to provide a negative supply voltage to the memory cells; a first negative power supply pattern formed on the second wiring layer, extending in the second direction, and connecting first power supply line landing pads, which are adjacent to each other in the second direction among the plurality of first power supply line landing pads, to each other; and a second negative power supply pattern formed on the third wiring layer and connected to the first negative power supply pattern.

According to example embodiments, there is provided a method of designing an integrated circuit including a plurality memory cells. The method may include: generating a path configured to provide a word line voltage to the memory cells; generating a path configured to provide a negative supply voltage to the memory cells; and generating a path configured to provide a bit line voltage to the memory cells. Here, the generating the path configured to provide the negative supply voltage to the memory cells may include: generating, on a first wiring layer, a plurality of first power supply line landing pads configured to provide the negative supply voltage to the memory cells; generating, on a second wiring layer, a first negative power supply pattern extending in a second direction, and connecting first power supply line landing pads, which are adjacent to each other in the second direction among the plurality of first power supply line landing pads, to each other; and generating, on a third wiring layer, a second negative power supply pattern connected to the first negative power supply pattern.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, various embodiments of the inventive concept will be described with reference to accompanying drawings. The embodiments described herein are all example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
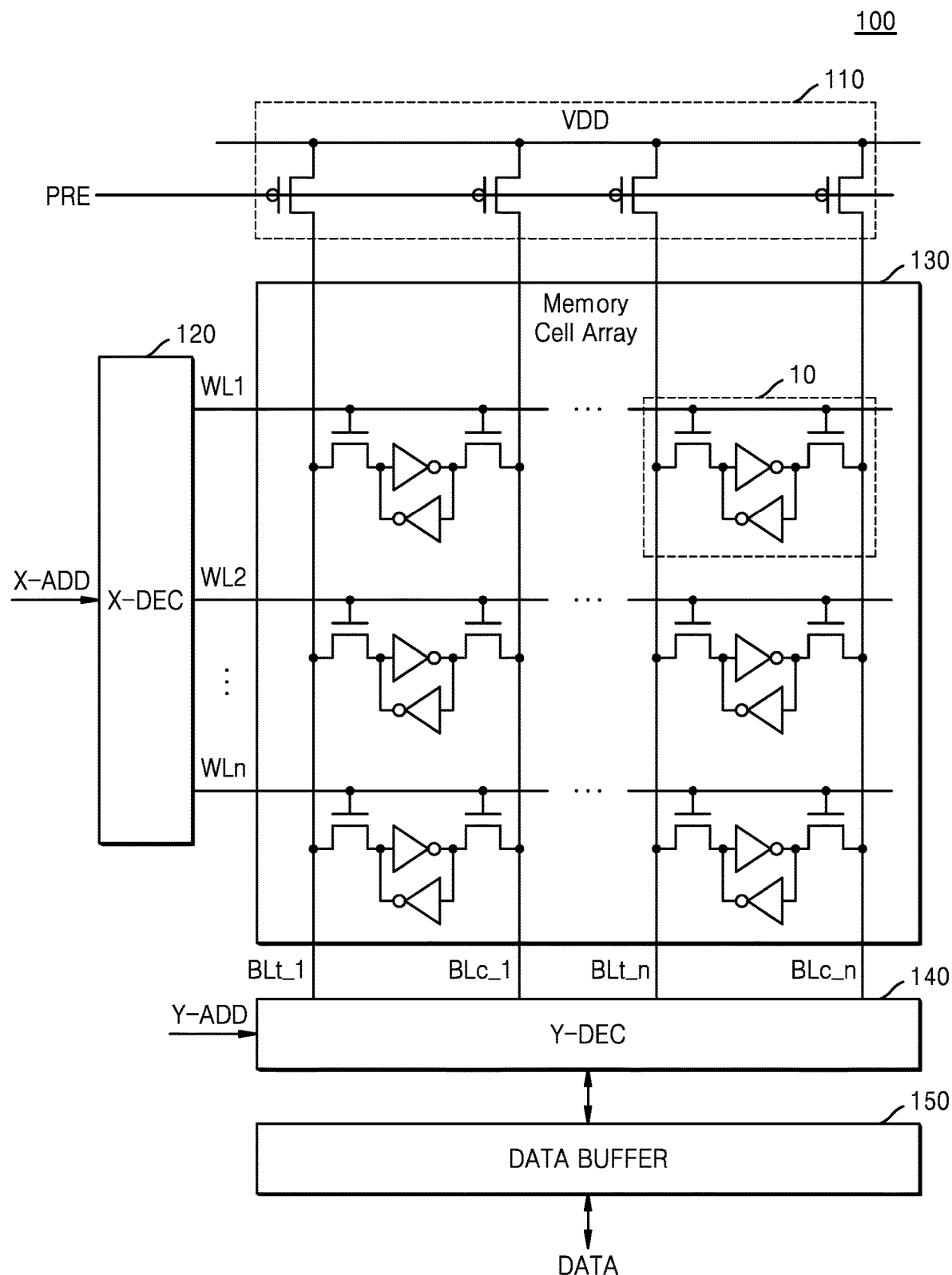
FIG. 1 is a diagram for describing an integrated circuit including a mixed-rows block, according to an example embodiment.

FIG. 1 is a diagram for describing a memory device 100 according to an example embodiment. Referring to FIG. 1, the memory device 100 may include a precharge circuit 110, a row decoder 120, a memory cell array 130, a column decoder 140 and a data buffer 150. Although not shown in FIG. 1, in some embodiments, the memory device 100 may further include an address decoder, a read circuit, a data input/output circuit, or the like.

The memory device 100 may receive a command CMD (not shown), an address, and data from the outside. For example, the memory device 100 may receive the command CMD (e.g., a write command) instructing to write, an address (e.g., a write address), and data (e.g., write data), and store the received data in an area corresponding to the address. In addition, the memory device 100 may receive another command CMD (e.g., a read command) instructing to read and an address (e.g., a read address), and may output data stored in an area corresponding to this address to the outside. The memory device 100 may be manufactured by a semiconductor manufacturing process, and may be a standalone memory or an embedded memory manufactured with other components by the semiconductor manufacturing process, as will be described below with reference to FIG. 16.

The precharge circuit 110 may selectively provide a positive supply voltage VDD to bit lines in response to a precharge control signal PRE.

The row decoder 120 may receive a row address X-ADD, and may activate one word line from among first to n-th word lines WL1 to WLn according to the row address X-ADD. In some embodiments, the memory device 100 may include an address decoder, and the address decoder may generate the row address X-ADD from an address received together with a command CMD.

The column decoder 140 may receive a column address Y-ADD, and may select some of a plurality of bit lines BLt_1 to BLc_n according to the column address Y-ADD. In some embodiments, the memory device 100 may include an address decoder, and the address decoder may generate the column address Y-ADD from the address received together with the command CMD.

The memory cell array 130 may include a plurality of memory cells (e.g., 10). In some embodiments, the plurality of memory cells 10 included in the memory cell array 130 may be volatile memory cells such as static random access memory (SRAM) cells, dynamic random access memory (DRAM) cells, or the like. In some embodiments, the plurality of memory cells 10 included in the memory cell array 130 may be non-volatile memory cells such as flash memory cells, resistive random access memory (RRAM) cells, or the like. Although example embodiments will be described with reference mainly to an SRAM cell, the example embodiments are not limited thereto.

Referring to FIG. 1, each of the plurality of memory cells 10 included in the memory cell array 130 may be connected to one of the first to n-th word lines WL1 to WLn sequentially arranged in the memory cell array 130 (wherein n is an integer greater than 1). In addition, each of the plurality of memory cells 10 included in the memory cell array 130 may be connected to at least one of the plurality of bit lines BLt_1 to BLc_n.

Some of the plurality of memory cells 10 may be selected by an activated word line among the first to n-th word lines WL1 to WLn. For example, memory cells 10 connected to the first word line WL1 may be selected by the first word line WL1, which is activated, and according to states of the plurality of bit lines BLt_1 to BLc_n, data (i.e., write data) may be written to the selected memory cells 10 or signals corresponding to data (i.e., read data) stored in the selected memory cells 10 may be output through the plurality of bit lines BLt_1 to BLc_n.

The data buffer 150 may temporarily store data (i.e., write data) to be written to the plurality of memory cells 10, or may temporarily store data (i.e., read data) read from the plurality of memory cells 10.

As the degree of integration of the memory cell array 130 increases, the resistance of lines connected to the memory cell array 130 may increase. For example, due to the increased resistance of lines, delay may occur in a signal applied to a word line, and a negative supply voltage VSS provided to each of the plurality of memory cells 10 may be unstably supplied. Accordingly, the resistance of a path providing a word line voltage and a path providing the negative supply voltage VSS is required to be reduced to improve the performance of the memory device 100.

Accordingly, the width of a word line pattern forming the path providing the word line voltage may be increased to reduce the resistance of the path in the memory device 100, according to an example embodiment. In addition, the cross-sectional area of a via forming the path providing the negative supply voltage VSS may be increased to reduce the resistance of the path in the memory device 100, according to an example embodiment.

The negative supply voltage VSS may sensitively react to noise and delay, and when the negative supply voltage VSS is provided to the plurality of memory cells 10 through different paths, the performance deviation of the plurality of memory cells 10 may increase.

Accordingly, the memory device 100 according to an example embodiment may stably provide the negative supply voltage VSS to the plurality of memory cells 10 through a mesh-shaped pattern formed on a plurality of wiring layers.

Figure 2:
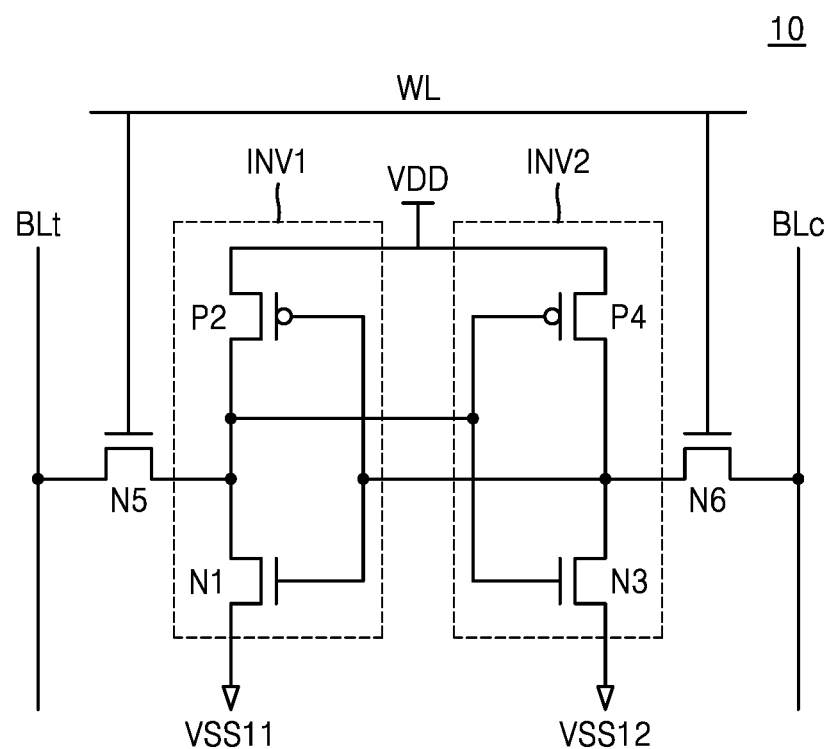
FIG. 2 is a circuit diagram illustrating a memory cell according to an example embodiment.

FIG. 2 is a circuit diagram illustrating the memory cell 10 according to an embodiment. Referring to FIG. 2, the memory cell 10 may include six transistors (i.e., first to sixth transistors N1, N3, N5, N6, P2 and P4). The first, third, fifth, and sixth transistors N1, N3, N5, and N6 may be n-channel field effect transistors (NFETs), and the second and fourth transistors P2 and P4 may be p-channel field effect transistors (PFETs). The memory cell 10 may be a six-transistor (6T)-SRAM cell, and may include a pair of inverters (i.e., first and second inverters INV1 and INV2) receiving the positive supply voltage VDD and the negative supply voltage (or ground voltage) VSS.

The first inverter INV1 may include the first and second transistors N1 and P2, and the second inverter INV2 may include the third and fourth transistors N3 and P4. As shown in FIG. 2, the first inverter INV1 may be cross-coupled to the second inverter INV2.

The fifth and sixth transistors N5 and N6 may be respectively connected to a bit line BLt and a complementary bit line BLc (or bit line bar), and voltage levels of the bit line BLt and the complementary bit line BLc may be provided to the first inverter INV1 and the second inverter INV2, respectively. Each of the fifth and sixth transistors N5 and N6 may be referred to as a pass transistor.

Each of the gates of the fifth and sixth transistors N5 and N6 may be connected to a word line WL. The fifth and sixth transistors N5 and N6 may be switched by the word line WL, and may provide the voltage levels of the bit line BLt and the complementary bit line BLc to the first inverter INV1 and the second inverter INV2, respectively.

Herein, transistors may have various different structures. For example, the transistors may include fin field effect transistors (FinFETs) formed by an active pattern extending in a fin shape and a gate electrode. The transistors may also include multi-bridge channel field effect transistors (MBCFETs) formed by a plurality of nanosheets extending in parallel to one another and a gate electrode. The transistors may include Forksheet FETs having a structure in which nanosheets for a P-type transistor and nanosheets for an N-type transistor are separated from each other by a dielectric wall, and thus, the N-type transistor and the P-type transistor are closer. The transistors may include vertical field effect transistors (VFETs) including source/drain regions apart from each other in a Z-axis direction of FIG. 3 and a gate electrode surrounding a channel region. The transistors may include a field effect transistor (FET) such as a complementary FET (CFET), a negative FET (NCFET), or a carbon nanotube (CNT) FET, and may also include a bipolar junction transistor or another 3-dimensional (3D) transistor.

Paths through which a word line voltage, the positive supply voltage VDD, negative supply voltages VSS11 and VSS12, and a bit line voltage are provided to the memory cell 10 may be formed in limited wiring layers. Because the driving characteristics for each voltage may be different depending on the resistance of a path through which a corresponding voltage is provided, forming a path having a low resistance may be important to improve the driving characteristics for each voltage.

Figure 3:
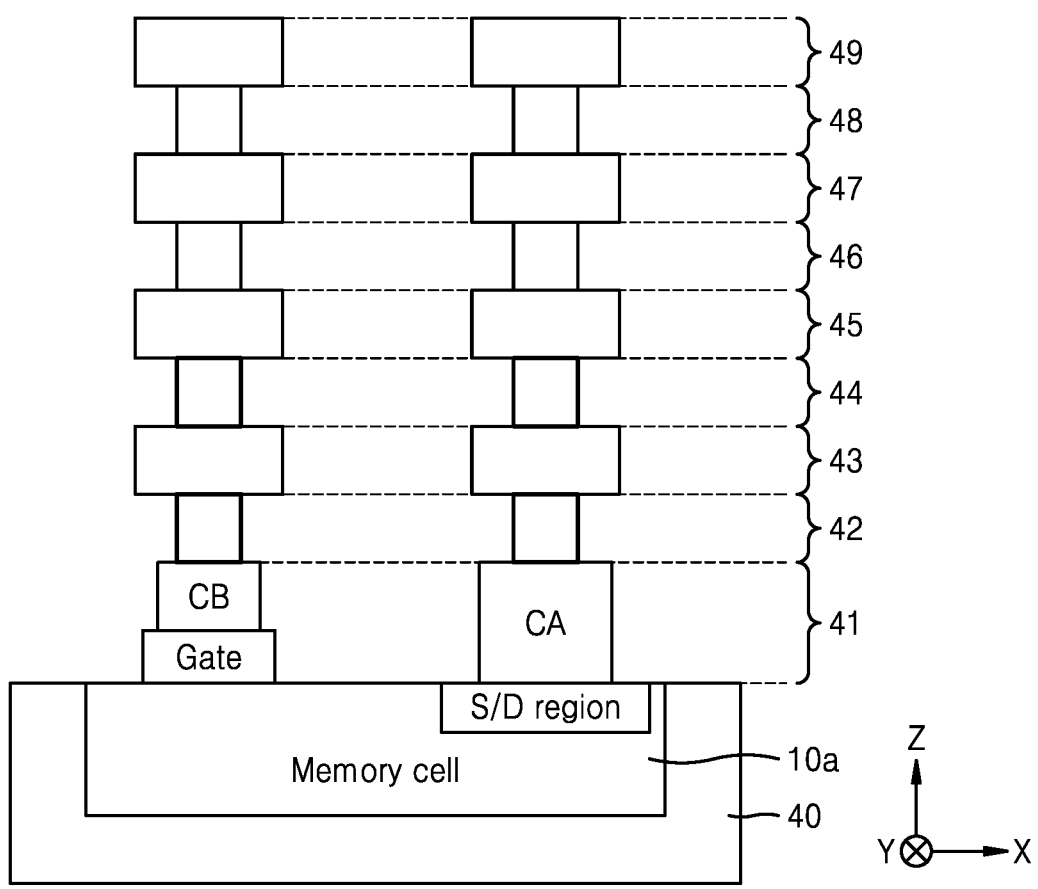
FIG. 3 is a cross-sectional view illustrating a wiring layer according to an example embodiment.

FIG. 3 is a cross-sectional view illustrating a wiring layer according to an example embodiment. Referring to FIG. 3, a plurality of layers (i.e., first to ninth layers 41 to 49) may be formed on a substrate 40. A memory cell 10a, which is an example of the memory cell 10 of FIG. 2, may be formed on the substrate 40, and the memory cell 10a may be a 6T-SRAM cell described above with reference to FIG. 2. The plurality of memory cells 10 included in the memory cell array 130 described above with reference to FIG. 1 may be formed on the substrate 40. FIG. 3 is only a cross-sectional view illustrating the first to ninth layers 41 to 49 formed on the memory cell 10a, and may be different from a cross-sectional view of an actual SRAM cell.

The first layer 41 may be referred to as a contact layer, and may include a gate contact CB connected to a gate electrode of a transistor and a source/drain contact CA connected to a source/drain region of the transistor. The first layer 41 may be referred to as M0, and may be formed in a middle-of-line (MOL) manufacturing operation, and the memory cell 10a and the first layer 41 may be formed in a front-end-of-line (FEOL) manufacturing operation.

Herein, the second layer 42 may be referred to as a contact via layer, and may be referred to as V0. The third layer 43 may be referred to as a first wiring layer M1. The fourth layer 44 may be referred to as a first via layer V1. The fifth layer 45 may be referred to as a second wiring layer M2. The sixth layer 46 may be referred to as a second via layer V2. The seventh layer 47 may be referred to as a third wiring layer M3. The eighth layer 48 may be referred to as a third via layer V3. The ninth layer 49 may be referred to as a fourth wiring layer M4. The second to ninth layers 42 to 49 may be formed in a back-end-of-line (BEOL) operation. In the drawings to be described below, only some layers are shown for convenience of illustration, and a via may be displayed, even though the via is under a pattern of an upper wiring layer, to indicate a connection between a pattern of the upper wiring layer and a pattern of a lower wiring layer.

Figure 4:
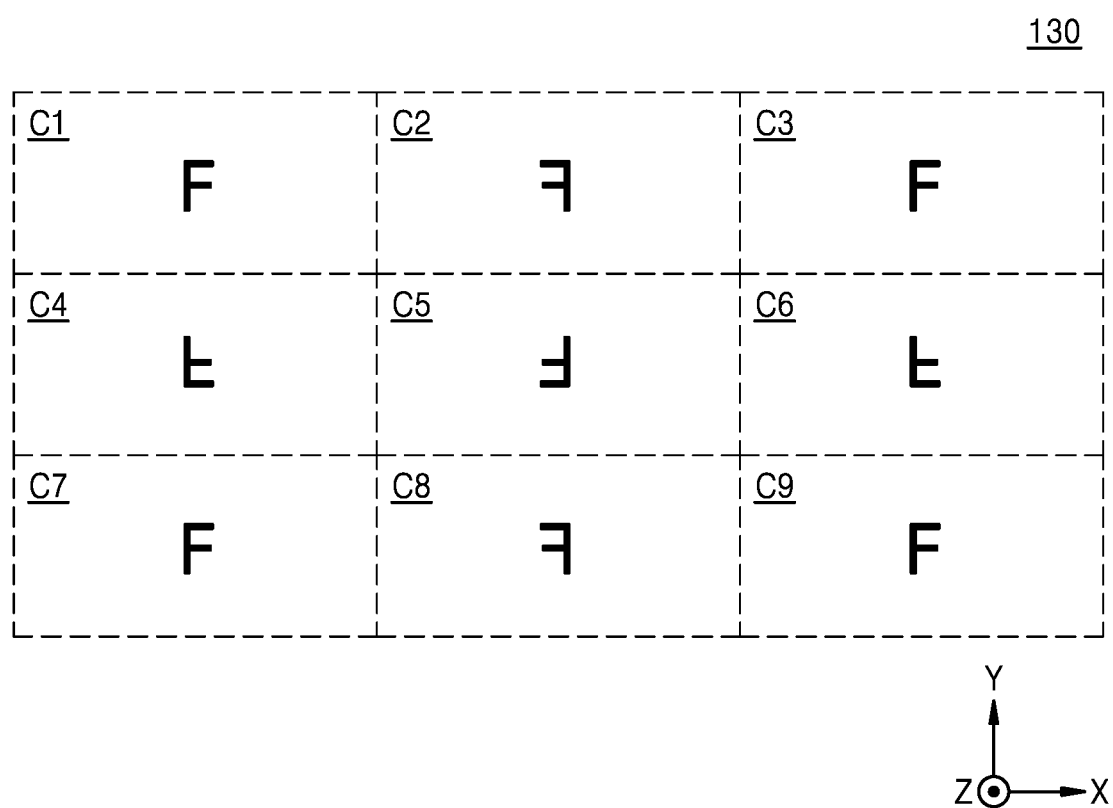
FIG. 4 is a plan view showing an arrangement of a memory cell array according to an example embodiment.
Figure 5:
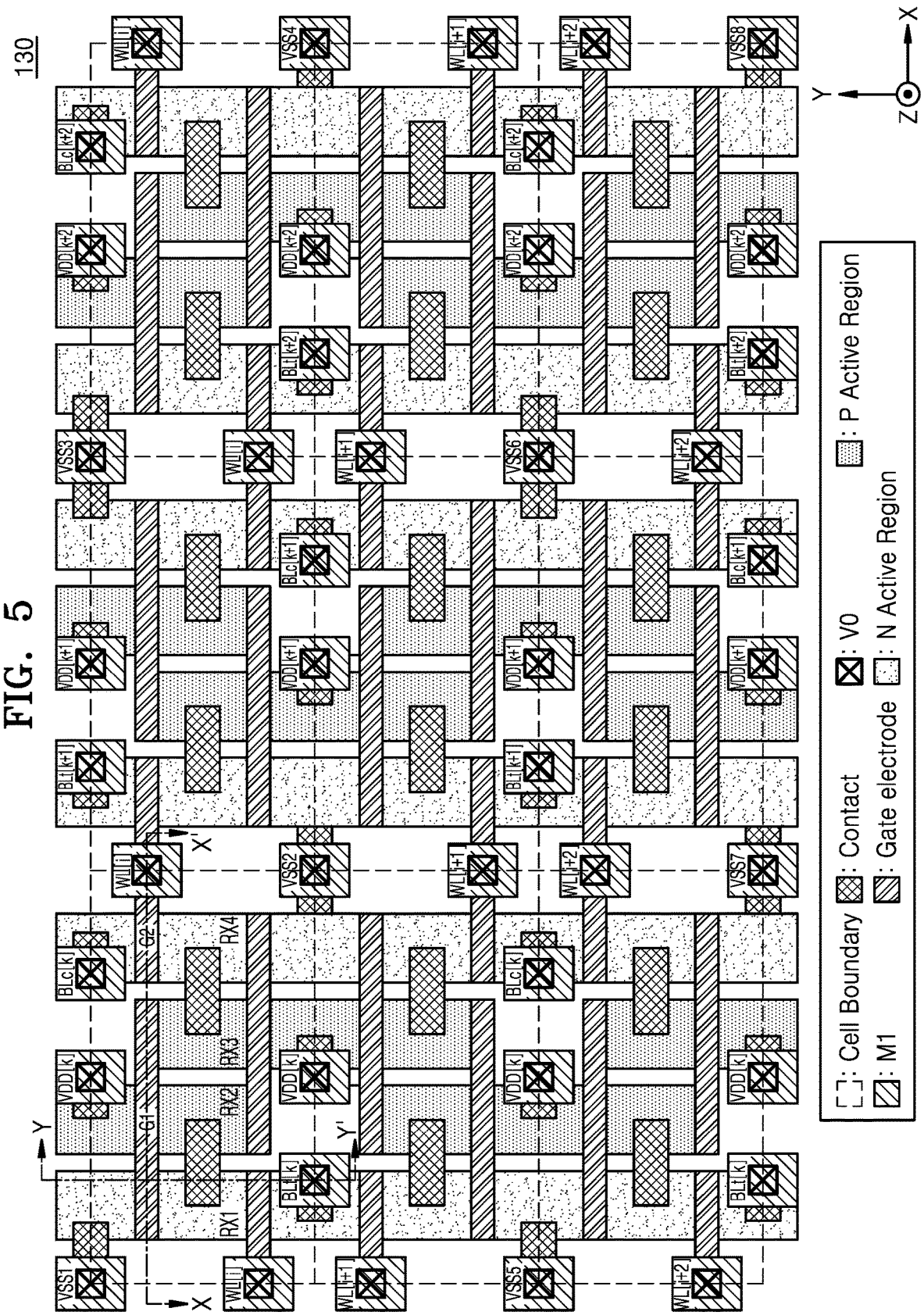
FIG. 5 is a plan view showing a layout of a memory cell array according to an example embodiment.

FIG. 4 is a plan view showing an arrangement of the memory cell array 130 according to an example embodiment. FIG. 5 is a plan view showing a layout of the memory cell array 130 according to an example embodiment.

In particular, FIG. 4 is a plan view illustrating an arrangement of nine memory cells (i.e., first to ninth memory cells C1 to C9) included in the memory cell array 130, and FIG. 5 is a plan view illustrating a layout corresponding to the first to ninth memory cells C1 to C9. In FIG. 5, reference characters written on patterns indicate a line electrically connected to a corresponding pattern and/or a voltage applied to the corresponding pattern.

Referring to FIG. 5, each of the first to ninth memory cells C1 to C9 included in the memory cell array 130 may have a layout mirror-symmetric with respect to an adjacent memory in a row direction or a column direction. For example, the layout of the first memory cell C1 and the layout of the second memory cell C2 may be mirror-symmetric in the column direction, that is, with respect to an axis parallel to a Y-axis therebetween. In addition, the layout of the fourth memory cell C4 and the layout of the first memory cell C1 may be mirror-symmetric in a row direction, that is, with respect to an axis parallel to an X-axis therebetween. In addition, the layout of the fifth memory cell C5 may be mirror-symmetric with the layout of the fourth memory cell C4 in the column direction and mirror-symmetric with the second memory cell C2 in the row direction. Referring to FIG. 5, because the first to third memory cells C1 to C3 may be arranged in the same row, the first to third memory cells C1 to C3 may be commonly connected to a word line WL[i]. Because the fourth to sixth memory cells C4 to C6 may be arranged in the same row, the fourth to sixth memory cells C4 to C6 may be commonly connected to a word line WL[i+1]. Because the seventh to ninth memory cells C7 to C9 may be arranged in the same row, the seventh to ninth memory cells C7 to C9 may be commonly connected to a word line WL[i+2]. For convenience of description, the same word line is illustrated as being separated in FIG. 5, the same word line may be connected in one pattern.

Referring to FIG. 5, the first, fourth, and seventh memory cells C1, C4, and C7 may be arranged in the same column, and may be commonly connected to the same bit line BLt[k], complementary bit line BLc[k], and positive power supply line VDD[k]. The second, fifth, and eighth memory cells C2, C5, and C8 may be arranged in the same column, and may be connected to the same bit line BLt[k+1], complementary bit line BLc[k+1], and positive power supply line VDD[k+1]. The third, sixth, and ninth memory cells C3, C6, and C9 may be arranged in the same column, and may be connected to the same bit line BLt[k+2], complementary bit line BLc[k+2], positive power supply line VDD[k+2]. For convenience of description, although the same bit line, complementary bit line, and positive power supply line are illustrated as being separated, the same bit line, complementary bit line, and positive power supply line may be connected in one pattern.

Each of the first to ninth memory cells C1 to C9 may be connected to a plurality of negative power supply lines. For example, referring to FIG. 5, the first memory cell C1 may be connected to the first negative power supply line VSS1 and the second negative power supply line VSS2 as shown in FIG. 2.

Each of the first to ninth memory cells C1 to C9 may include a plurality of transistors formed in a plurality of active regions. For example, the first memory cell C1 may include a plurality of transistors formed in first to fourth active regions RX1 to RX4. A transistor formed in an N-type active region may be referred to as an N-type transistor. A transistor formed in a P-type active region may be referred to as a P-type transistor. Although not illustrated in FIG. 5, an active pattern may be formed in an active region. The active pattern may be in the form of a fin or a nanosheet.

Figure 6A:
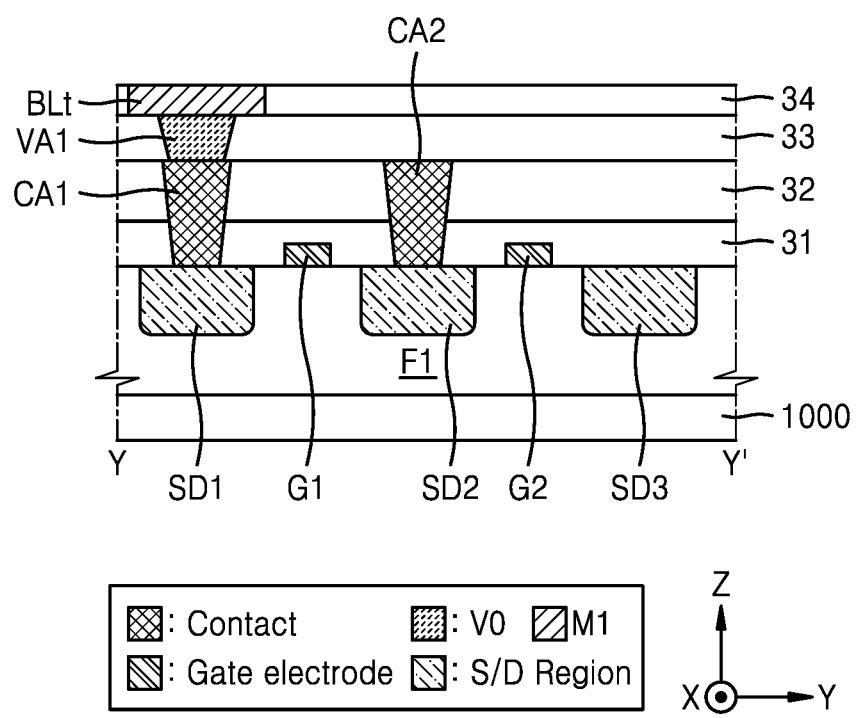
FIGS. 6A and 6B are cross-sectional views showing examples of structures of a cell according to an example embodiment.
Figure 6B:
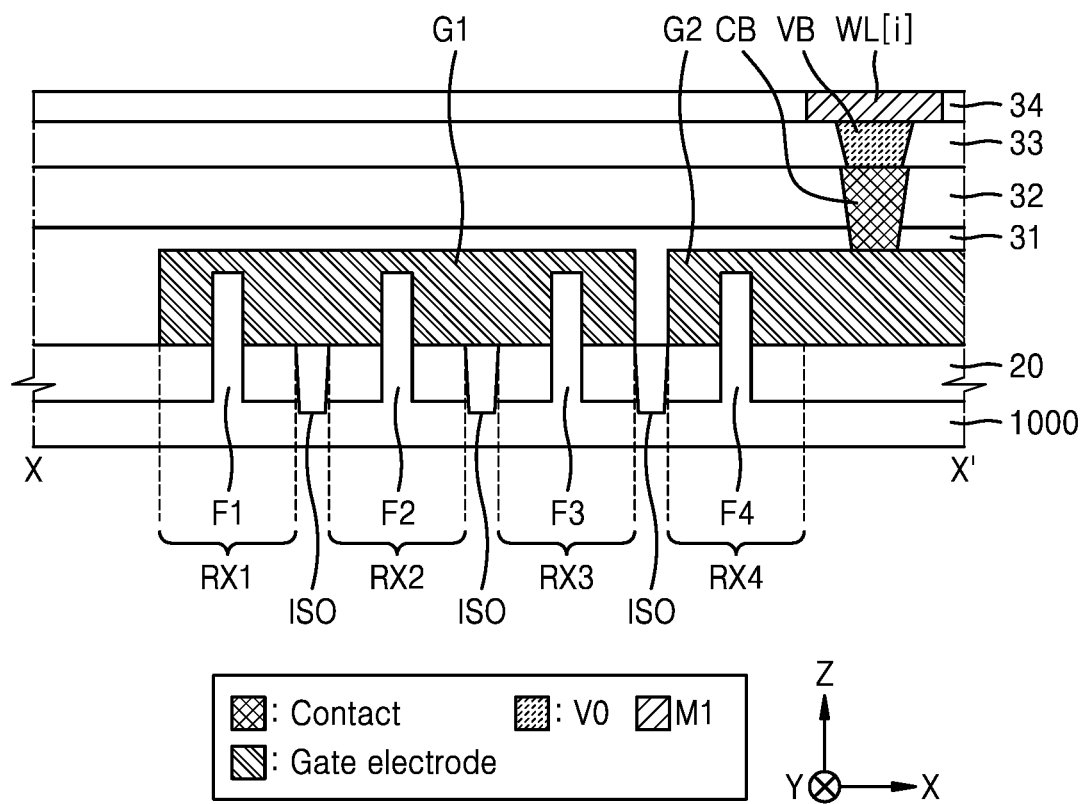

FIGS. 6A and 6B are cross-sectional views showing examples of a cell having a finFET structure according to an example embodiment. In detail, FIG. 6A is a cross-sectional view showing an example of a cross-section of the first cell C1 taken along line Y-Y' of FIG. 5, and FIG. 6B is a cross-sectional view showing an example of a cross-section of the first cell C1 taken along X-X' of FIG. 5. Although not shown in FIGS. 6A and 6B, a gate spacer may be formed on a side surface of a gate electrode, and a gate dielectric film may be formed between the gate electrode and the gate spacer and on a lower surface of the gate electrode. Also, a barrier film may be formed on a surface of a contact and/or a via. Hereinafter, FIGS. 6A and 6B will be described with reference to FIG. 5, and redundant descriptions of FIGS. 6A and 6B will be omitted.

Referring to FIG. 6A, a substrate 1000 may be bulk silicon or a silicon-on-insulator (SOI), and as an unlimited example, may include silicon germanium (SiGe), silicon germanium on insulator (SGOI), indium antimonide (InSb), lead tellurium (PbTe) compound, indium arsenide (InAs), phosphide, gallium arsenide (GaAs), gallium antimonide (GaSb), or the like. A first fin F1 may extend in an Y-axis direction on the substrate 1000, and first to third source/drain regions SD1 to SD3 may be formed in the first fin F1. First to fourth interlayer insulating films 31 to 34 may be formed on the first fin F1. The first and second source/drain regions SD1 and SD2 along with a first gate electrode G1 may form a transistor, that is, a p-type field effect transistor (PFET), and the second and third source/drain regions SD2 and SD3 along with a second gate electrode G2 may form another PFET.

First and second source/drain contacts CA1 and CA2 may be respectively connected to the first and second source/drain regions SD1 and SD2 by penetrating the second interlayer insulating film 32. According to some embodiments, at least one of the first and second source/drain contacts CA1 and CA2 may be formed as a lower source/drain contact penetrating the first interlayer insulating film 31 and an upper source/drain contact penetrating the second interlayer insulating film 32. A first source/drain via VA1 may be connected to the first source/drain contact CA1 by penetrating the third interlayer insulating film 33, and may be connected to a bit line pattern BLt formed on the first wiring layer M1.

Referring to FIG. 6B, a field insulating film 20 may be formed on the substrate 1000, and first to fourth fins F1 to F4 penetrating through the field insulating film 20 may cross first and second gate electrodes G1 and G2 extending in the X-axis direction. The field insulating film 20 may include, as an unlimited example, silicon dioxide ($SiO_2$), silicon nitride (SiN), silicon oxynitride (SiON), silicon oxycarbide nitride (SiOCN), or a combination of two or more of $SiO_2$, SiN, SiON, and SiOCN. The first and second gate electrodes G1 and G2 may include, as an unlimited example, titanium (Ti), tantalum (Ta), tungsten (W), aluminum (Al), copper (Co), or a combination of two or more of Ti, Ta, W, Al, and Co, or may include silicon (Si) or SiGe, which is not a metal. Also, the first and second gate electrodes G1 and G2 may be formed by stacking two or more conductive materials, and for example, may include a work function adjusting film including titanium nitride (TiN), tantalum nitride (TaN), titanium carbide (TiC), titanium carbide (TaC), titanium aluminum carbide (TiAlC), or a combination of two or more of TiN, TaN, TiC, TaC, and TiAlC, and a filling conductive film including W, Al, or the like. A device isolation film ISO may extend in the Y-axis direction between the first fin F1 and the second fin F2, the device isolation film ISO may extend in the Y-axis direction between the second fin F2 and the third fin F3, and the device isolation film ISO may extend in the Y-axis direction between the third fin F3 and the fourth fin F4. A region in which the first fin F1 is formed may be the first active region RX1, a region in which the second fin F2 is formed may be the second active region RX2, a region in which a third fin F3 is formed may be the third active region RX3, and a region in which the fourth fin F4 is formed may be the fourth active region RX4.

A gate contact CB may be connected to the second gate electrode G2 by penetrating the second interlayer insulating film 32. In some embodiments, the gate contact CB may be formed as a lower gate contact penetrating the first interlayer insulating film 31 and an upper gate contact penetrating the second interlayer insulating film 32. A gate via VB may be connected to the gate contact CB by penetrating the third interlayer insulating film 33, and may be connected to a word line pattern WL[i] formed on the first wiring layer M1.

Figure 6C:
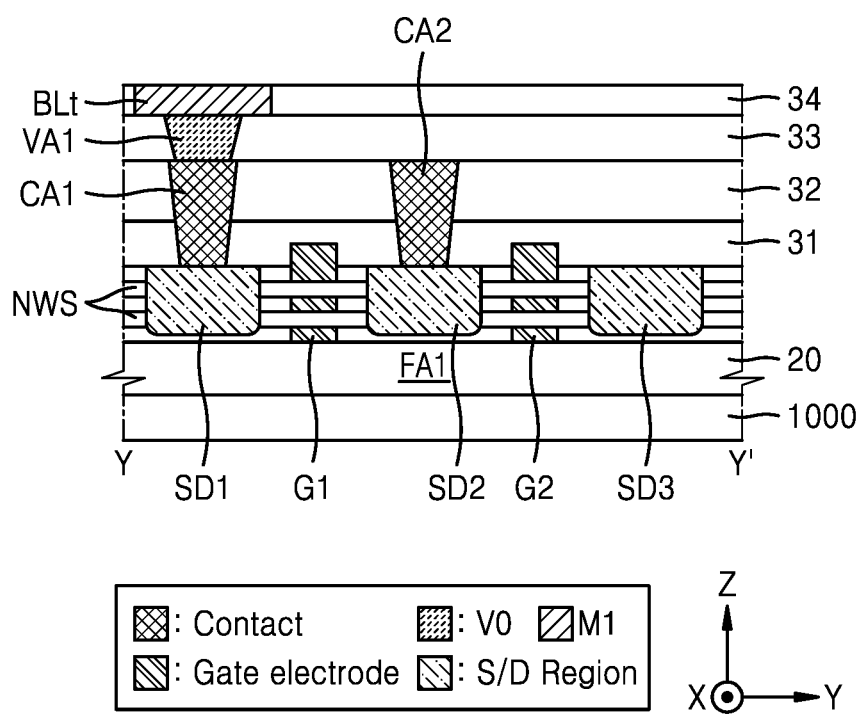
FIGS. 6C and 6D are cross-sectional views showing examples of a cell having a gate-all-around (GAA) structure, according to an example embodiment.
Figure 6D:
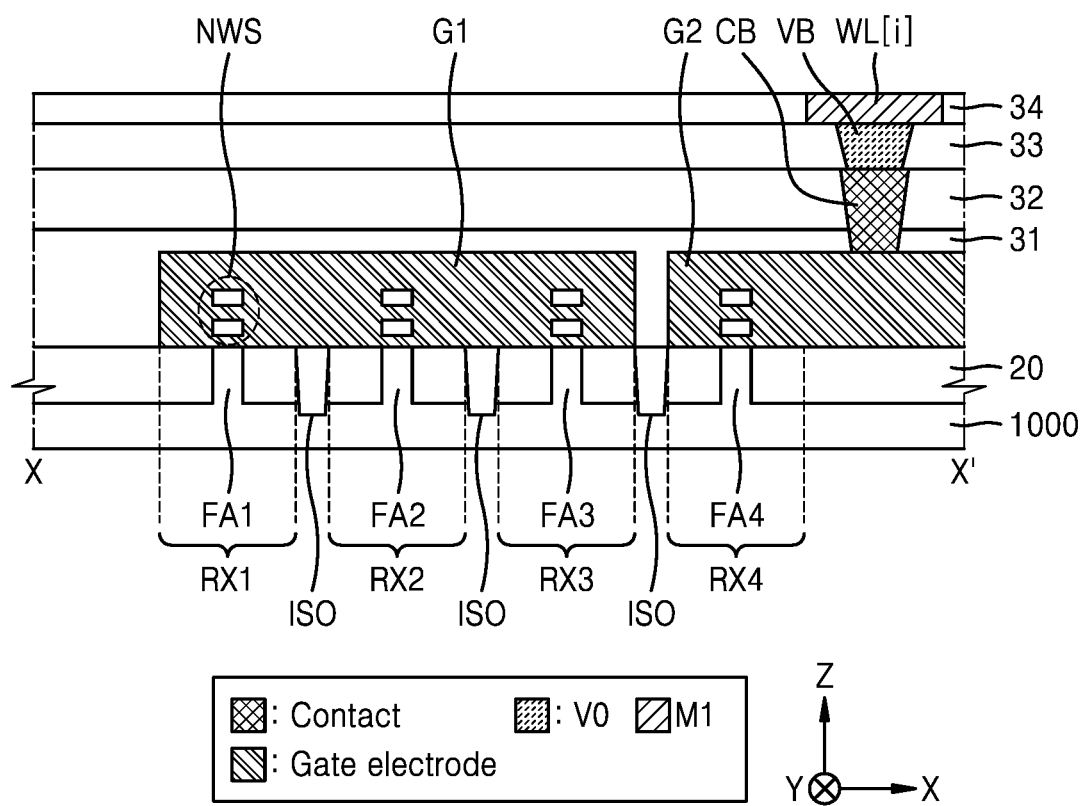

FIGS. 6C and 6D are cross-sectional views showing examples of a cell having a gate-all-around (GAA) transistor structure, according to an example embodiment. In detail, FIG. 6C is a cross-sectional view showing an example of a cross-section of the first cell C1 taken along line Y-Y' of FIG. 5, and FIG. 6D is a cross-sectional view showing an example of a cross-section of the first cell C1 taken along line X-X' of FIG. 5. FIGS. 6C and 6D may also be cross-sectional views of a cell having the GAA transistor structure in which a channel region is surrounded by a gate electrode. For example, the cross-sectional views shown in FIGS. 6C and 6D may be cross-sectional views of a cell including a multi-bridge channel (MBC) transistor.

Unlike FIG. 6A, referring to FIG. 6C, a first fin-type active region FA1 on the substrate 1000 may extend in the Y-axis direction, and may include a nanowire structure NWS formed at a position apart from the first fin-type active region FA1 in a Z-axis direction. The nanowire structure NWS may include nanowires extending in parallel to an upper surface of the first fin-type active region FA1. The nanowires may be sequentially stacked on the first fin-type active region FA1, and each of the nanowires may have a channel region. The nanowires may include the same material as the configuring component of the substrate 1000. However, the inventive concept is not limited thereto, a nanosheet structure NSS instead of the nanowire structure NWS may be formed at a position apart from the first fin-type active region FA1 in the Z-axis direction.

The first to third source/drain regions SD1 to SD3 may be formed on the first fin-type active region FA1. Each of the first to third source/drain regions SD1 to SD3 may be connected to the nanowire structure NWS. Although not illustrated in FIG. 6C, an insulating liner covering side surfaces of the first and second gate electrodes G1 and G2 may be formed on the nanowire structure NWS, and a spacer may be formed on the insulating liner.

Unlike FIG. 6B, referring to FIG. 6D, a plurality of fin-type active regions FA1 to FA4 protruding from the substrate 1000 and extending in the Y-axis direction may be included. A nanowire structure NWS may be formed at a position apart from each of the plurality of fin-type active regions FA1 to FA4 in the Z-axis direction. The cross-section of a nanowire is shown in a rectangular shape, but is not limited thereto, and may have various shapes.

Figure 7:
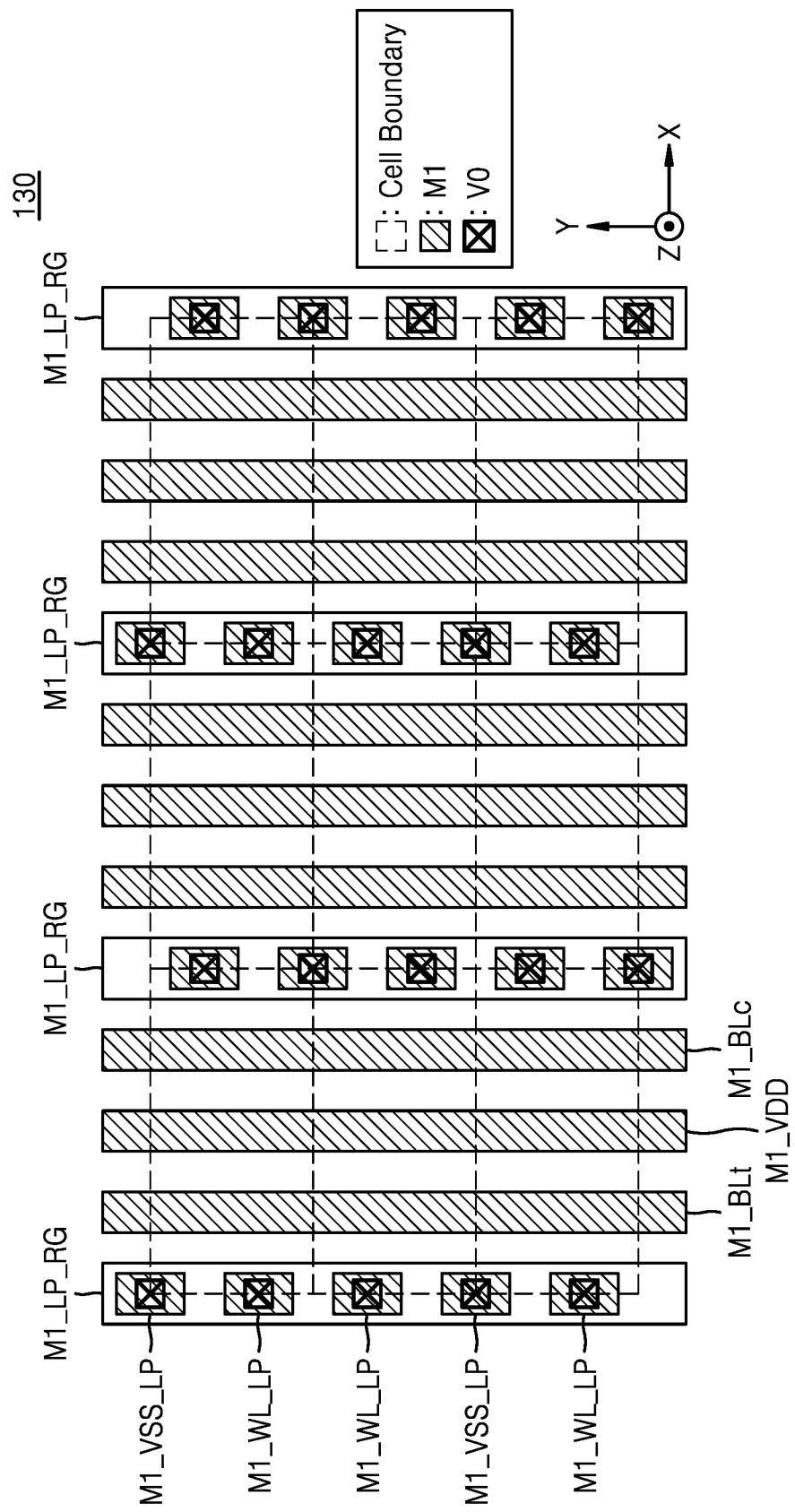
FIG. 7 is a plan view illustrating a wiring layer of a memory cell array according to an example embodiment.

FIG. 7 is a plan view illustrating a wiring layer of the memory cell array 130 according to an example embodiment. In detail, FIG. 7 is a plan view illustrating a contact via layer V0 and the first wiring layer M1 formed on the memory cell array 130 on an X-Y plane, but descriptions with reference to FIG. 7 may be applied to any via layers and wiring layers that are successively stacked. For convenience of description, active regions, active patterns, gate electrodes, contacts, or the like described above with reference to FIGS. 5 to 6B may not be shown in plan views to be described below.

Referring to FIG. 7, a first bit line pattern M1_BLt and a first complementary bit line pattern M1_BLc may be formed on the first wiring layer M1. The first bit line pattern M1_BLt and the first complementary bit line pattern M1_BLc may extend in a Y-axis direction (e.g., first direction). A plurality of first bit line patterns M1_BLt and a plurality of first complementary bit line patterns M1_BLc may be arranged alternatively. A positive voltage pattern M1_VDD providing the positive supply voltage VDD may be formed on the first wiring layer M1. A plurality of positive voltage patterns VDD may extend between first bit line patterns M1_BLt and first complementary bit line patterns M1_BLc in the Y-axis direction, respectively. Referring to FIG. 7, landing pad regions M1_LP_RG of the first wiring layer M1 may extend in the Y-axis direction, and each of the landing pad regions M1_LP_RG may be adjacent to the first bit line patterns M1_BLt or the first complementary bit line patterns M1_BLc.

Each of the landing pad regions M1_LP_RG of the first wiring layer M1 may include a plurality of first negative supply voltage VSS landing pads M1_VSS_LP, and a plurality of first word line landing pads M1_WL_LP. The first negative supply voltage VSS landing pads M1_VSS_LP and the plurality of first word line landing pads M1_WL_LP included in the landing pad region M1_LP_RG may be aligned in the Y-axis direction. A landing pad may connect a pattern of an upper layer to a pattern of a lower layer.

For example, as shown in FIGS. 2 and 3, a first negative supply voltage VSS landing pad M1_VSS_LP may be connected to source terminals of the first transistor N1 and the third transistor N3 through source/drain contacts. Each of the first negative supply voltage VSS landing pads M1_VSS_LP may be formed on a boundary of a memory cell. In particular, each of the first negative supply voltage VSS landing pads M1_VSS_LP may be formed on the corner or edge of the boundary of the memory cell. The memory cell may be the SRAM cell shown in FIG. 2. The first negative supply voltage VSS landing pads M1_VSS_LP may also be arranged to overlap a first negative voltage pattern M2_VSS extending in an X-axis direction (e.g., second direction) on the second wiring layer M2, as will be described below with reference to FIG. 8B.

The first word line landing pads M1_WL_LP may be connected to gate terminals of the fifth transistor N5 and the sixth transistors N6 through gate contacts, as shown in FIGS. 2 and 3. The first word line landing pads M1_WL_LP may be formed on the boundary of a memory cell. In detail, the first word line landing pads M1_WL_LP may be formed on the left boundary or the right boundary of a memory cell. The memory cell may be the SRAM cell shown in FIG. 2. The first word line landing pads M1_WL_LP may be arranged to overlap a first word line pattern M2_WL extending in the X-axis direction on the second wiring layer M2, as will be described below with reference to FIG. 8B.

Figure 8A:
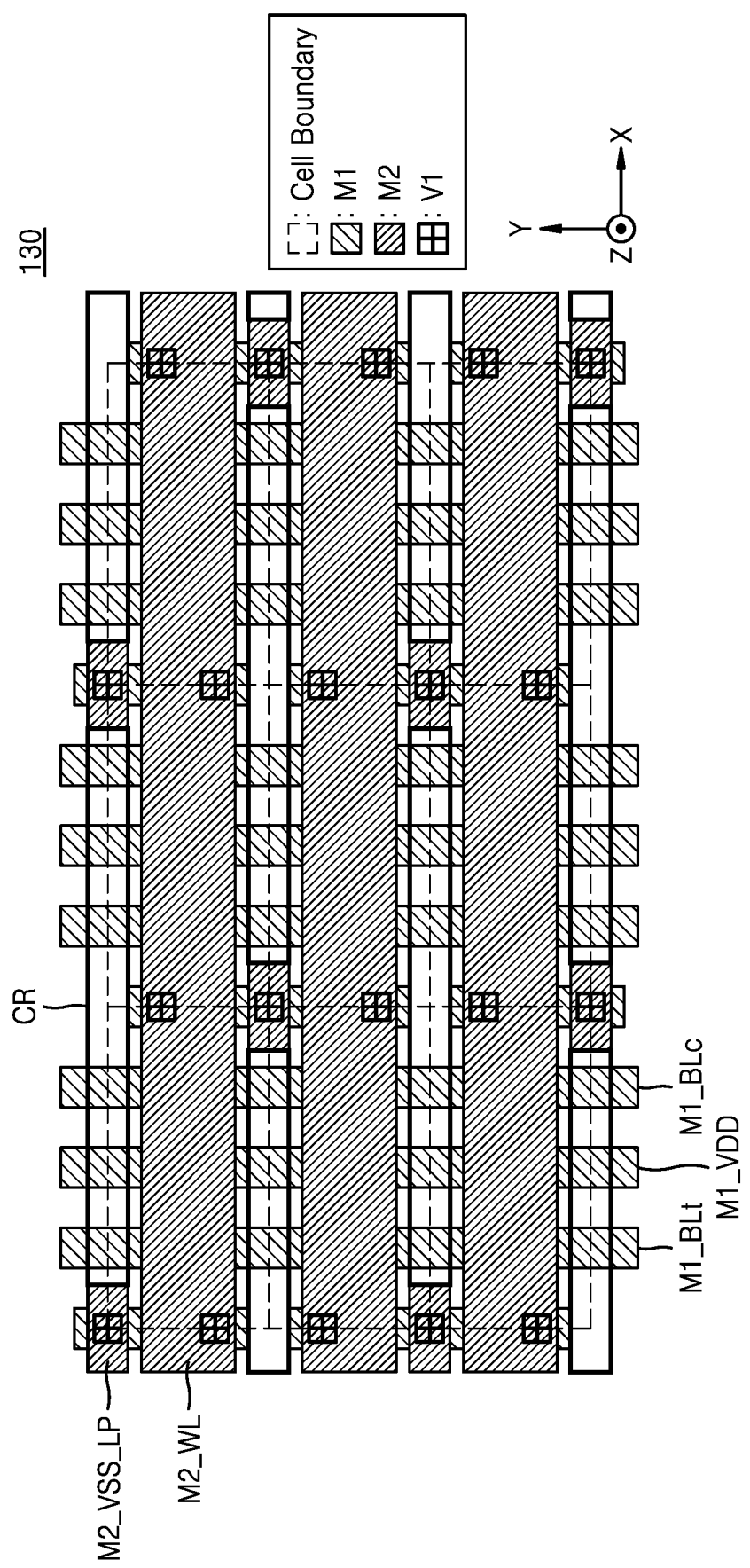
FIG. 8A is a plan view illustrating a wiring layer of a memory cell array according to an example embodiment.

FIG. 8A is a plan view illustrating a wiring layer of the memory cell array 130 according to an example embodiment. In detail, FIG. 8A is a plan view illustrating a first via layer V1 and the second wiring layer M2 formed on the memory cell array 130 on an X-Y plane, and descriptions with reference to FIG. 8A may be applied to any via layers and wiring layers that are successively stacked.

Referring to FIG. 8A, a second negative voltage landing pad M2_VSS_LP and the first word line pattern M2_WL may be formed on the second wiring layer M2. The first word line pattern M2_WL may extend in the X-axis direction (e.g., second direction). The second negative voltage landing pad M2_VSS_LP may be arranged at the corner or edge of a cell boundary. The second negative voltage landing pad M2_VSS_LP may be connected to the first negative supply voltage VSS landing pad M1_VSS_LP formed on the first wiring layer M1 through a via formed on the first via layer V1. One second negative voltage landing pad M2_VSS_LP may be connected to one via in a Z-direction (e.g., third direction). Accordingly, the second negative voltage landing pad M2_VSS_LP may transmit the negative supply voltage VSS transmitted from an upper wiring layer to a lower wiring layer.

A cut region CR may be formed between a plurality of second negative voltage landing pads M2_VSS_LP adjacent to each other in the X-axis direction. The cut region CR may be a region in which a pattern of the wiring layer M2 is not formed.

Figure 8B:
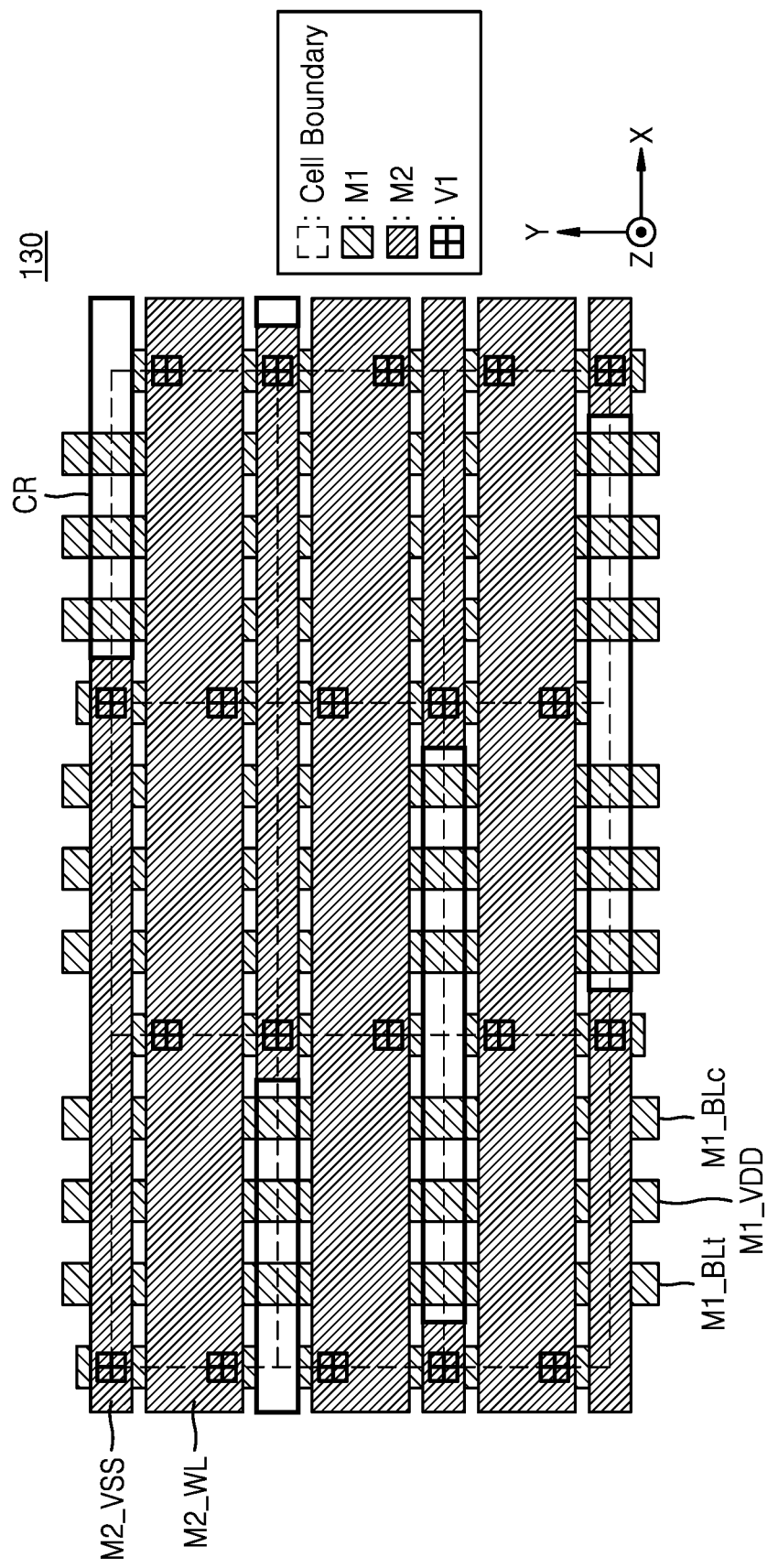
FIG. 8B is a plan view illustrating a wiring layer of a memory cell array according to an example embodiment.

FIG. 8B is a plan view illustrating a wiring layer of the memory cell array 130 according to an example embodiment. In detail, FIG. 8B is a plan view illustrating the first via layer V1 and the second wiring layer M2 formed on the memory cell array 130 on an X-Y plane, and descriptions with reference to FIG. 8B may be applied to any via layer and wiring layer that are successively stacked.

Referring to FIG. 8B, the first negative voltage pattern M2_VSS and the first word line pattern M2_WL may be formed on the second wiring layer M2. Each of the first negative voltage pattern M2_VSS and the first word line pattern M2_WL may extend in the X-axis direction (e.g., second direction). A plurality of first negative voltage patterns M2_VSS and a plurality of first word line patterns M2_WL may be alternately arranged in the Y-axis direction (e.g., first direction) to be parallel to each other.

Referring to FIG. 8B, the plurality of first negative voltage patterns M2_VSS may be connected to the plurality of first negative supply voltage VSS landing pads M1_VSS_LP formed on the first wiring layer M1 through vias formed in the first via layer V1. In detail, the plurality of first negative voltage patterns M2_VSS may connect the plurality of first negative supply voltage VSS landing pads M1_VSS_LP arranged on the first wiring layer M1 in the X-axis direction to one another. The first negative voltage patterns M2_VSS may connect the plurality of first negative supply voltage VSS landing pads M1_VSS_LP to one another, wherein the plurality of first negative supply voltage VSS landing pads M1_VSS_LP are formed on edge boundaries of at least two memory cells adjacent to each other in the X-axis direction. However, the inventive concept is not limited thereto, and the first negative voltage patterns M2_VSS may also connect the plurality of first negative supply voltage VSS landing pads M1_VSS_LP to one another, wherein the plurality of first negative supply voltage VSS landing pads M1_VSS_LP are formed on edge boundaries of at least three adjacent memory cells.

The first negative voltage pattern M2_VSS may connect a preset number of first negative supply voltage VSS landing pads to one another. For example, referring to FIG. 8B, the first negative voltage pattern M2_VSS may connect two first negative supply voltage VSS landing pads to each other, but embodiments are not limited thereto.

The first negative voltage pattern M2_VSS may connect a certain number of first negative supply voltage VSS landing pads to one another and be terminated. For example, referring to FIG. 8B, the first negative voltage pattern M2_VSS may connect two first negative supply voltage VSS landing pads to each other and be terminated.

The memory cell array 130 may include a first cut region. The first cut region may be a region in which the first negative voltage pattern M2_VSS is not formed. That is, the first cut region may be formed between two first negative voltage patterns M2_VSS adjacent to each other in the X-axis direction. The first cut region may extend in the X-axis direction, and may be terminated at a point in contact with the first negative voltage pattern M2_VSS.

As the first negative voltage pattern M2_VSS becomes longer, a coupling capacitance with the first word line pattern M2_WL may increase. When the coupling capacitance increases, an RC delay increases, and thus, the word line driving characteristics may decrease.

The memory cell array 130 according to an example embodiment may reduce the length of the first negative voltage pattern M2_VSS by including the first cut region, and thus, the word line driving characteristics may be improved.

Meanwhile, as the first negative voltage pattern M2_VSS according to an example embodiment is connected to at least two first negative supply voltage VSS landing pads M1_VSS_LP, resistance of a power supply line providing a negative supply voltage may be reduced. Accordingly, driving characteristics of a power supply line providing a negative supply voltage may be improved.

Referring to FIG. 8B, the first word line pattern M2_WL may be connected to a plurality of first word line landing pads M1_WL_LP formed on the first wiring layer M1 through vias formed in the first via layer V1. Referring to FIG. 8B, in the first via layer V1, vias corresponding to each of the plurality of first word line landing pads M1_WL_LP are shown to be formed, but vias corresponding to some word line landing pads may not be formed.

Figure 9:
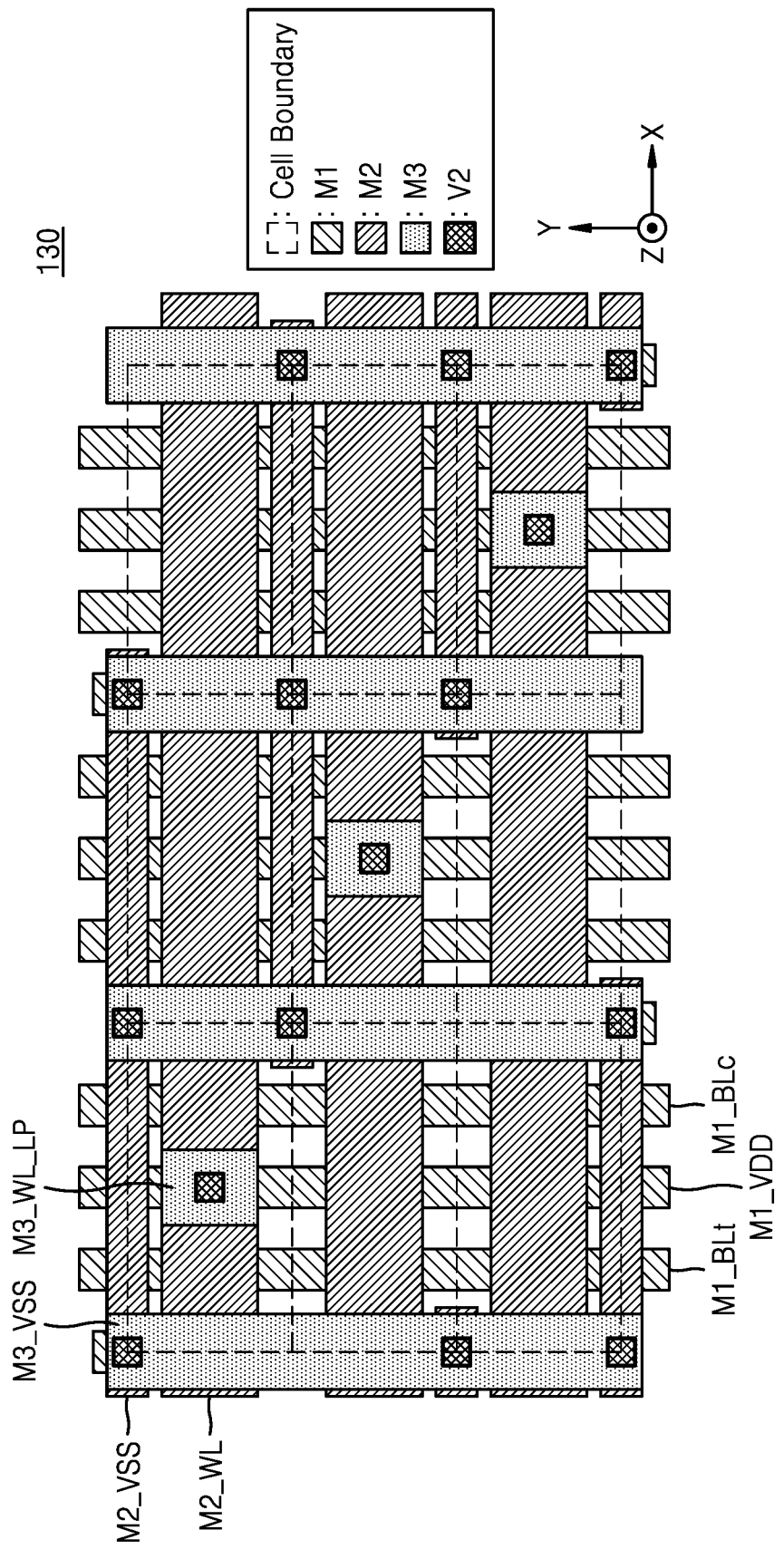
FIG. 9 is a plan view illustrating a wiring layer of a memory cell array according to an example embodiment.

FIG. 9 is a plan view illustrating a wiring layer of the memory cell array 130 according to an example embodiment. In detail, FIG. 9 is a plan view illustrating the second via layer V2 and a third wiring layer M3 formed on the memory cell array 130 on an X-Y plane, and descriptions with reference to FIG. 9 may be applied to any via layer and wiring layer that are successively stacked.

Referring to FIG. 9 a plurality of second negative voltage pattern M3_VSS and a plurality of second word line landing pads M3_WL_LP may be formed on the third wiring layer M3. The plurality of second negative voltage pattern M3_VSS and the plurality of second word line landing pads M3_WL_LP may extend in the Y-axis direction (e.g., first direction). The second negative voltage pattern M3_VSS may be formed on the boundary of a memory cell. The plurality of second negative voltage patterns M3_VSS and the plurality of second word line landing pads M3_WL_LP may be alternately arranged to be parallel to one another in the X-axis direction.

Each of the plurality of second word line landing pads M3_WL_LP may connect the first word line pattern M2_WL formed on the second wiring layer M2 to a second word line pattern M4_WL formed on a fourth wiring layer M4 to be described later.

Referring to FIG. 9, the second negative voltage pattern M3_VSS may be connected to the first negative voltage pattern M2_VSS formed on the second wiring layer M2 through vias formed in the second via layer V2. As the first negative voltage pattern M2_VSS is connected to the second negative voltage pattern M3_VSS, a mesh pattern providing the negative supply voltage VSS may be formed. That is, the first negative voltage pattern M2_VSS extending in the X-axis direction connects the plurality of first negative supply voltage VSS landing pads M1_VSS_LP of adjacent memory cells to one another, and the second negative voltage pattern M3_VSS extending in the Y-axis direction is connected to the first negative voltage pattern M2_VSS, and thus a mesh pattern may be formed.

An integrated circuit according to an example embodiment may commonly provide negative supply voltages VSS to a plurality of memory cells included in the memory cell array 130 through a mesh pattern formed through the second wiring layer M2 and the third wiring layer M3, and thus a stable negative supply voltage VSS may be provided even when the degree of integration of the integrated circuit increases.

Figure 10:
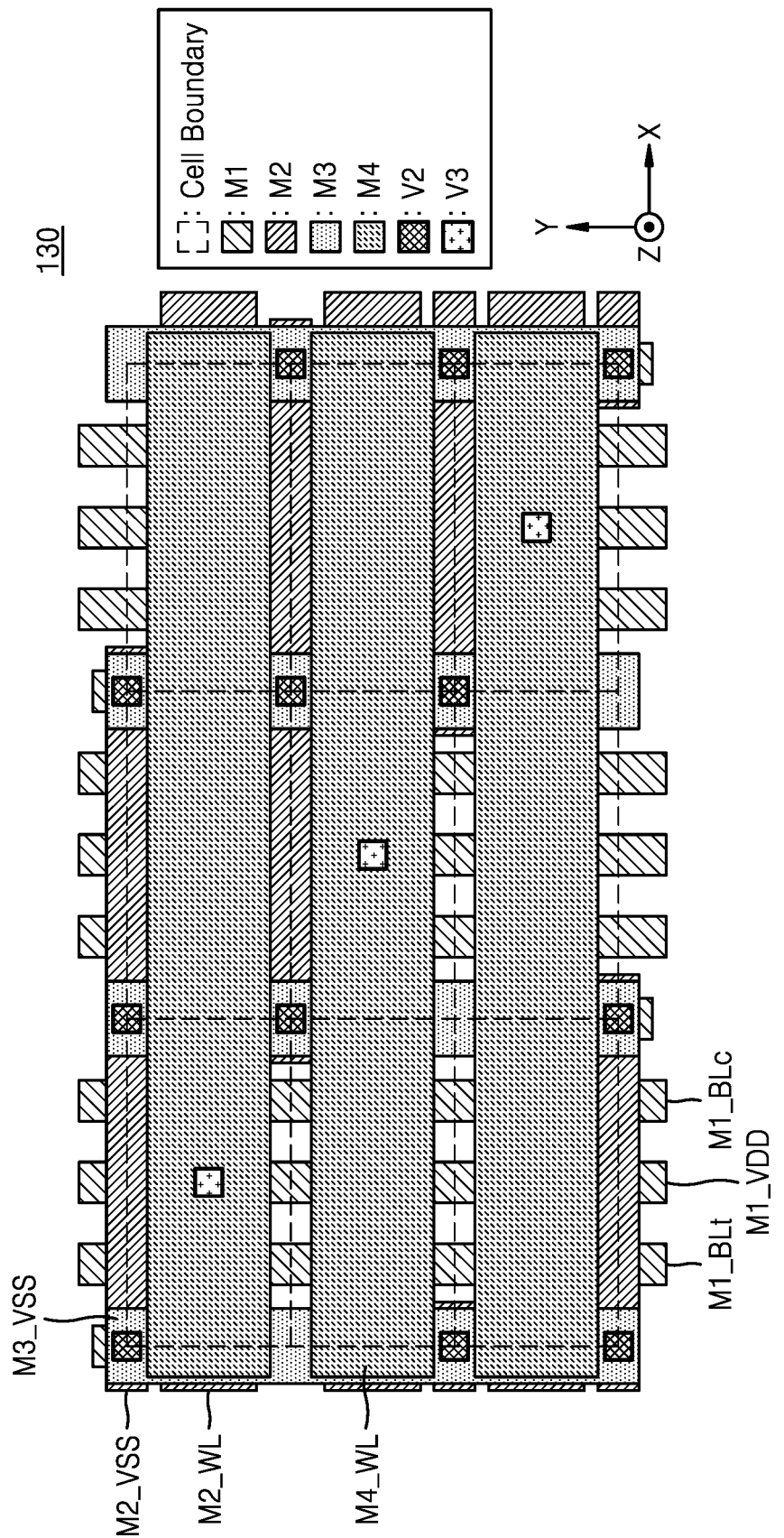
FIG. 10 is a plan view illustrating a wiring layer of a memory cell array according to an example embodiment.

FIG. 10 is a plan view illustrating a wiring layer of the memory cell 130 array according to an example embodiment. In detail, FIG. 10 is a plan view illustrating the third via layer V3 and the fourth wiring layer M4 formed on the memory cell array 130 on an X-Y plane, and descriptions with reference to FIG. 10 may be applied to any via layer and wiring layer that are successively stacked.

Referring to FIG. 10, a second word line pattern M4_WL may be formed on the fourth wiring layer M4. Each of a plurality of second word line patterns M4_WL may extend in the X-axis direction (e.g., second direction). The plurality of second word line patterns M4_WL may be arranged to be parallel to one another.

Referring to FIG. 10, the second word line pattern M4_WL may be connected to the first word line pattern M2_WL formed on the second wiring layer M2 through a via formed in the third via layer V3.

Referring to FIG. 10, the fourth wiring layer M4 may be dedicated to the second word line pattern M4_WL. That is, other patterns than the second word line pattern M4_WL may not be formed on the fourth wiring layer M4, and the plurality of second word line patterns M4_WL may be arranged in the Y-axis direction to be parallel to one another. As the fourth wiring layer M4 is dedicated to the second word line pattern M4_WL, the width of the second word line pattern M4_WL may be increased. Accordingly, because the resistance caused by the second word line pattern M4_WL may be reduced, word line driving characteristics of a word line may be improved.

Figure 11A:
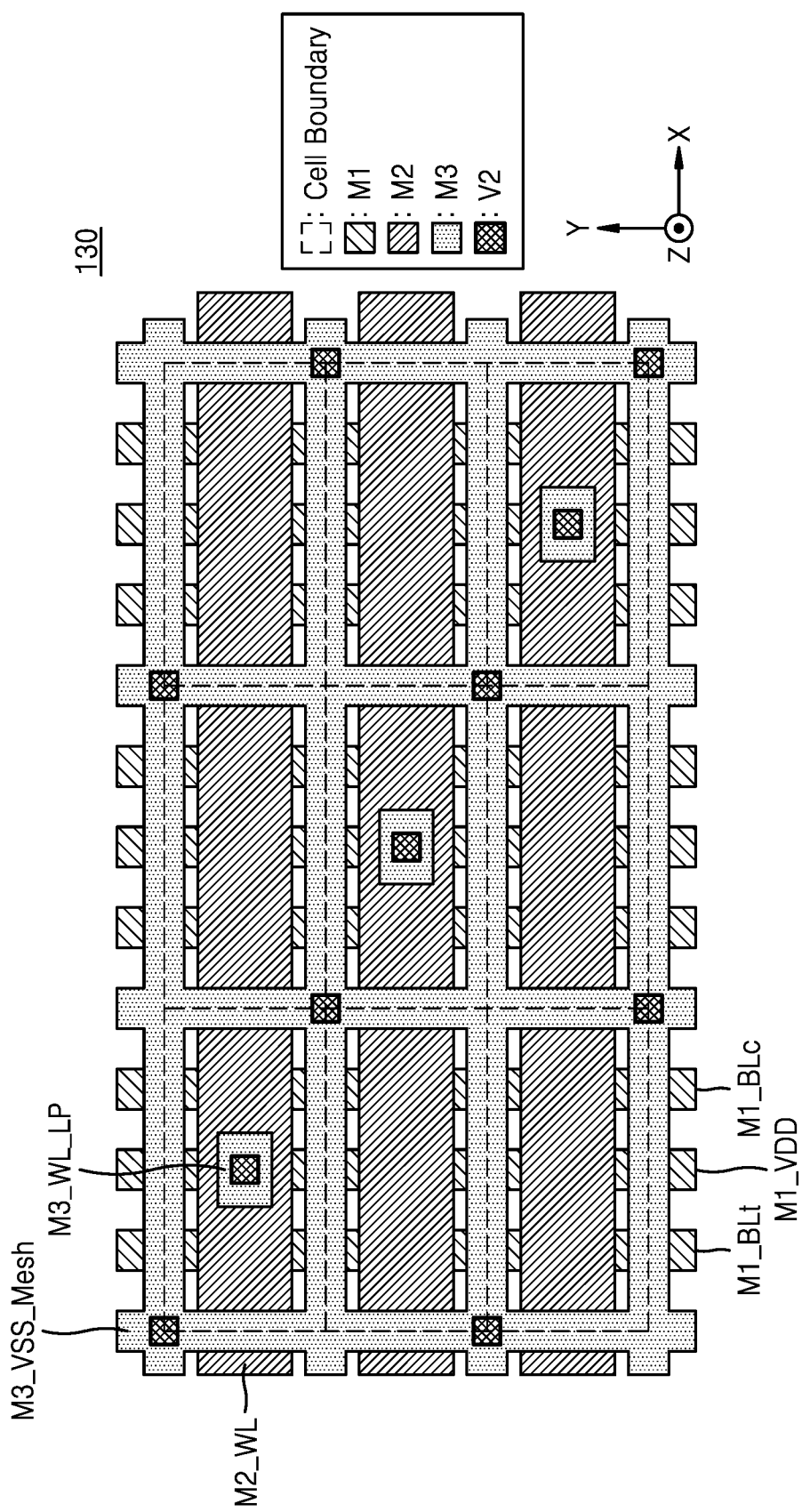
FIG. 11A is a plan view illustrating a wiring layer of a memory cell array according to an example embodiment.

FIG. 11A is a plan view illustrating a wiring layer of the memory cell array 130 according to an example embodiment. In detail, FIG. 11A is a plan view illustrating the second via layer V2 and the third wiring layer M3 formed on the memory cell array 130 on an X-Y plane, and descriptions with reference to FIG. 11A may be applied to any via layer and wiring layer that are successively stacked.

Referring to FIG. 11A, unlike a case where the second negative voltage pattern M3_VSS in a line shape is formed on the third wiring layer in FIG. 9, a mesh-shaped second negative voltage pattern M3_VSS Mesh may be formed on the third wiring layer M3. That is, unlike a case where the second negative voltage pattern M3_VSS has a line shape extending in the Y-axis direction in FIG. 9, the mesh-shaped second negative voltage pattern M3_VSS Mesh of FIG. 11A may have a shape in which lines extending in the X-axis direction and the Y-axis direction are connected. Accordingly, because the area of a path for providing the negative supply voltage VSS in the third wiring layer M3 is increased, the resistance may be reduced, and the driving characteristics of the negative supply voltage VSS may be improved.

The mesh-shaped second negative voltage pattern M3_VSS Mesh formed on the third wiring layer M3 shown in FIG. 11A may be formed above the second wiring layer M2 shown in FIG. 8A. Accordingly, the mesh-shaped second negative voltage pattern M3_VSS Mesh may be connected to the second negative voltage landing pad M2_VSS_LP formed on the second wiring layer M2 through vias formed in the second via layer V2. That is, vias of the second via layer V2 may be formed on the second negative voltage landing pad M2_VSS_LP.

Figure 11B:
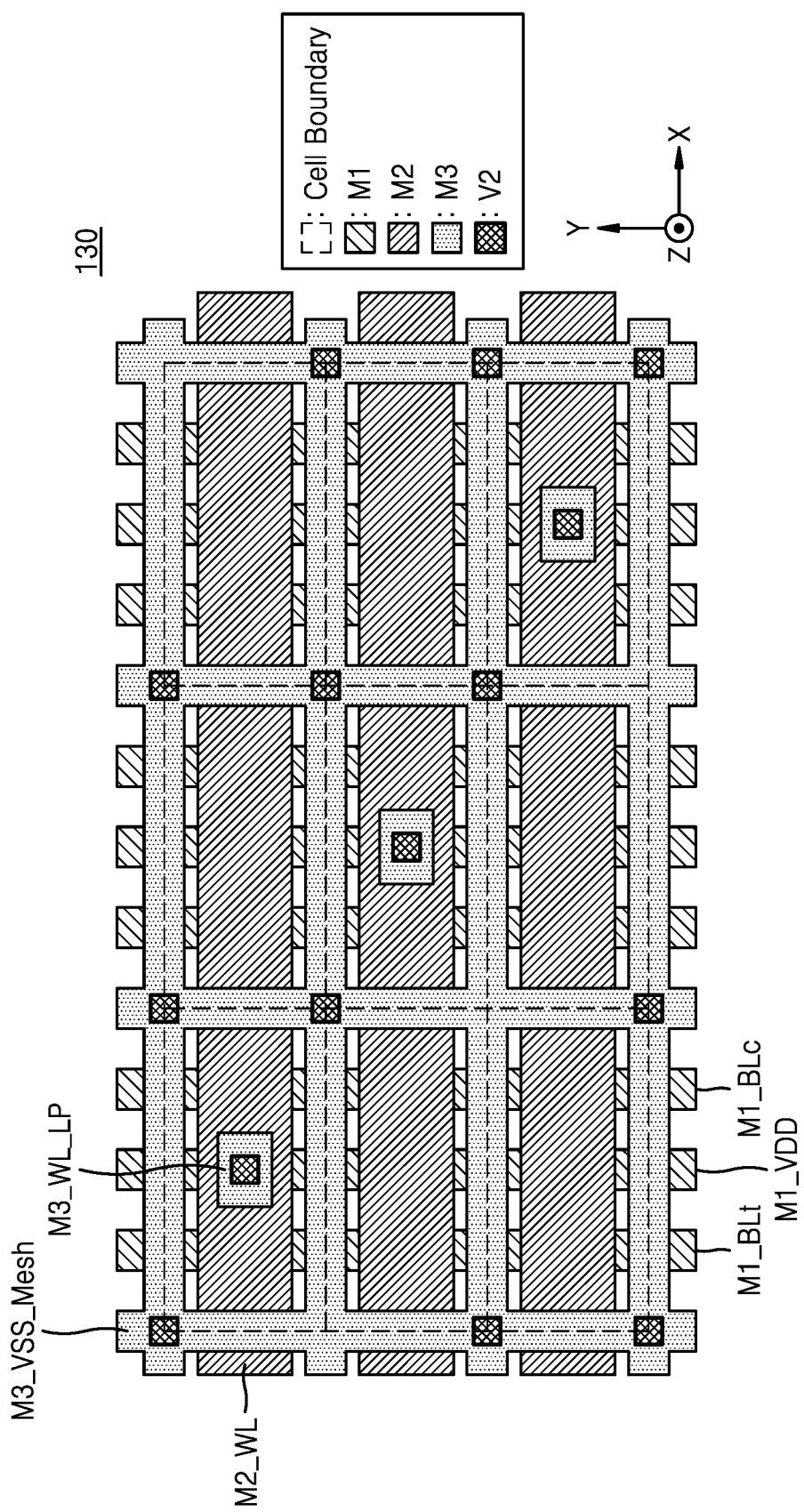
FIG. 11B is a plan view illustrating a wiring layer of a memory cell array according to an example embodiment.

FIG. 11B is a plan view illustrating a wiring layer of the memory cell array 130 according to an example embodiment. In detail, FIG. 11B is a plan view illustrating the second via layer V2 and the third wiring layer M3 formed on the memory cell array 130 on an X-Y plane, and descriptions with reference to FIG. 11B may be applied to any via layer and wiring layer that are successively stacked.

Referring to FIG. 11B, unlike FIG. 11A, the meshed-shaped second negative voltage pattern M3_VSS Mesh formed on the third wiring layer M3 shown in FIG. 11B may be formed above the second wiring layer M2 shown in FIG. 8B. Accordingly, the meshed-shaped second negative voltage pattern M3_VSS Mesh may be connected to the first negative voltage pattern M2_VSS formed on the second wiring layer M2 through vias formed in the second via layer V2. That is, vias of the second via layer V2 may be formed on the first negative voltage pattern M2_VSS. Because the first negative voltage pattern M2_VSS may be arranged in a greater region than that of the second negative voltage landing pad M2_VSS_LP, the number of vias of the second via layer V2 may increase. As the number of vias of the second via layer V2 increases, the resistance of a pattern for providing the negative supply voltage VSS may decrease, and as the resistance decreases, the driving characteristics of the negative supply voltage VSS may be improved.

Figure 12:
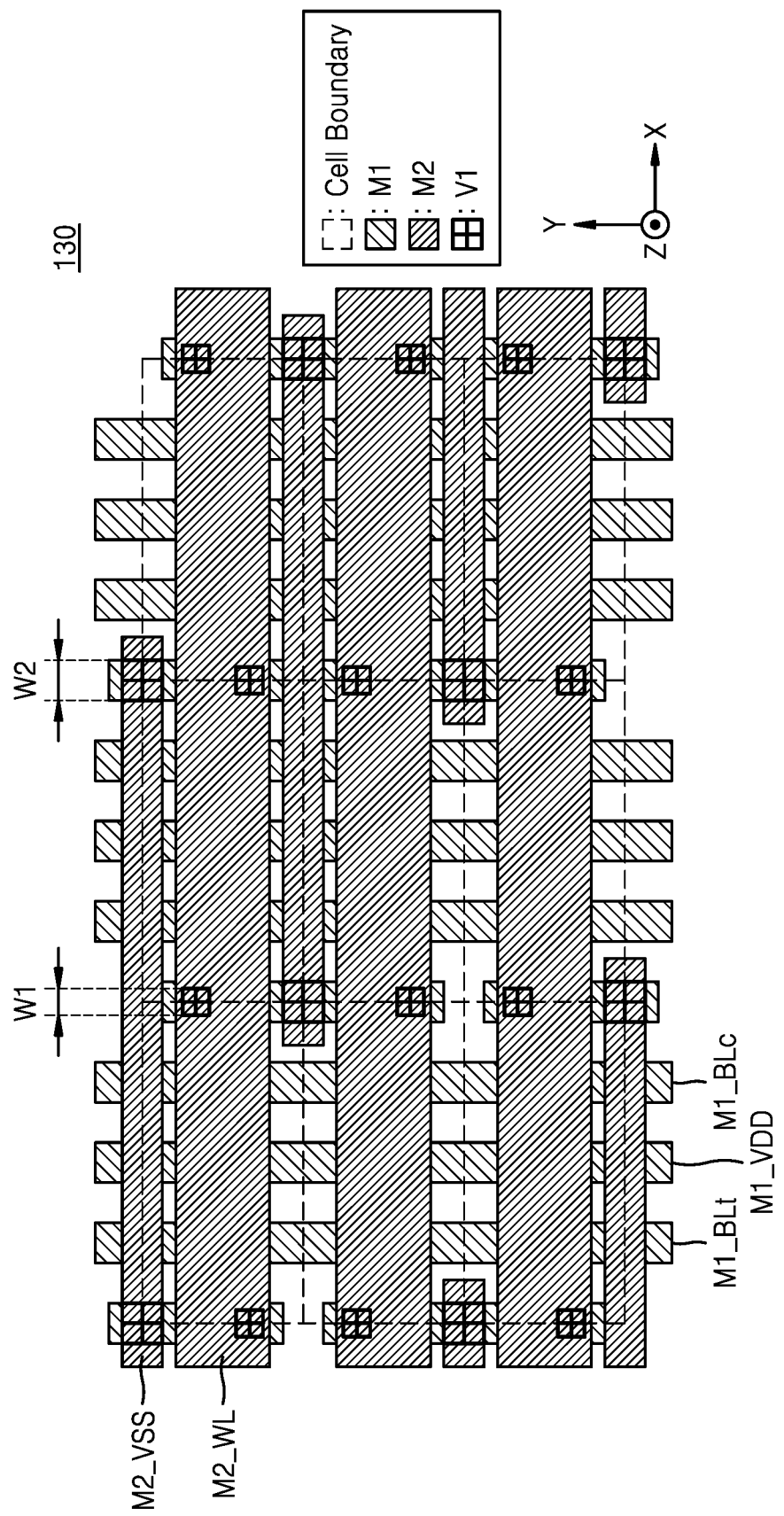
FIG. 12 is a plan view illustrating a wiring layer of a memory cell array according to an example embodiment.

FIG. 12 is a plan view illustrating a wiring layer of the memory cell array 130 according to an example embodiment. In detail, FIG. 12 is a plan view illustrating the first via layer V1 and the second wiring layer M2 formed on the memory cell array 130 on an X-Y plane, and descriptions with reference to FIG. 12 may be applied to any via layer and wiring layer that are successively stacked.

Referring to FIG. 12, the first negative voltage pattern M2_VSS and the first word line pattern M2_WL may be formed on the second wiring layer M2. Each of the first negative voltage pattern M2_VSS and the first word line pattern M2_WL may extend in the X-axis direction (e.g., second direction). A plurality of first negative voltage patterns M2_VSS and a plurality of first word line patterns M2_WL may be alternately arranged in the Y-axis direction (e.g., first direction) to be parallel to each other.

Referring to FIG. 12, the plurality of first negative voltage patterns M2_VSS may be connected to the plurality of first negative voltage landing pads M1_VSS_LP formed on the first wiring layer M1 through vias formed in the first via layer V1. In addition, the plurality of first word line patterns M2_WL may be connected to a plurality of first word line landing pads M1_WL_LP (for example, described in FIG. 7) formed on the first wiring layer M1 through vias formed in the first via layer V1.

According to an example embodiment, a width W2 of a via connected to the first negative voltage pattern M2_VSS may be greater than a width W1 of a via connected to the first word line pattern M2_WL. Alternatively, the cross-sectional area of the via connected to the first negative voltage pattern M2_VSS may be greater than the cross-sectional area of the via connected to the first word line pattern M2_WL. As the cross-sectional area of the via connected to the first negative voltage pattern M2_VSS increases, the resistance of a path through which the negative supply voltage VSS is transmitted to a memory cell may be reduced, and the driving characteristics of the negative supply voltage VSS may be improved.

Figure 13:
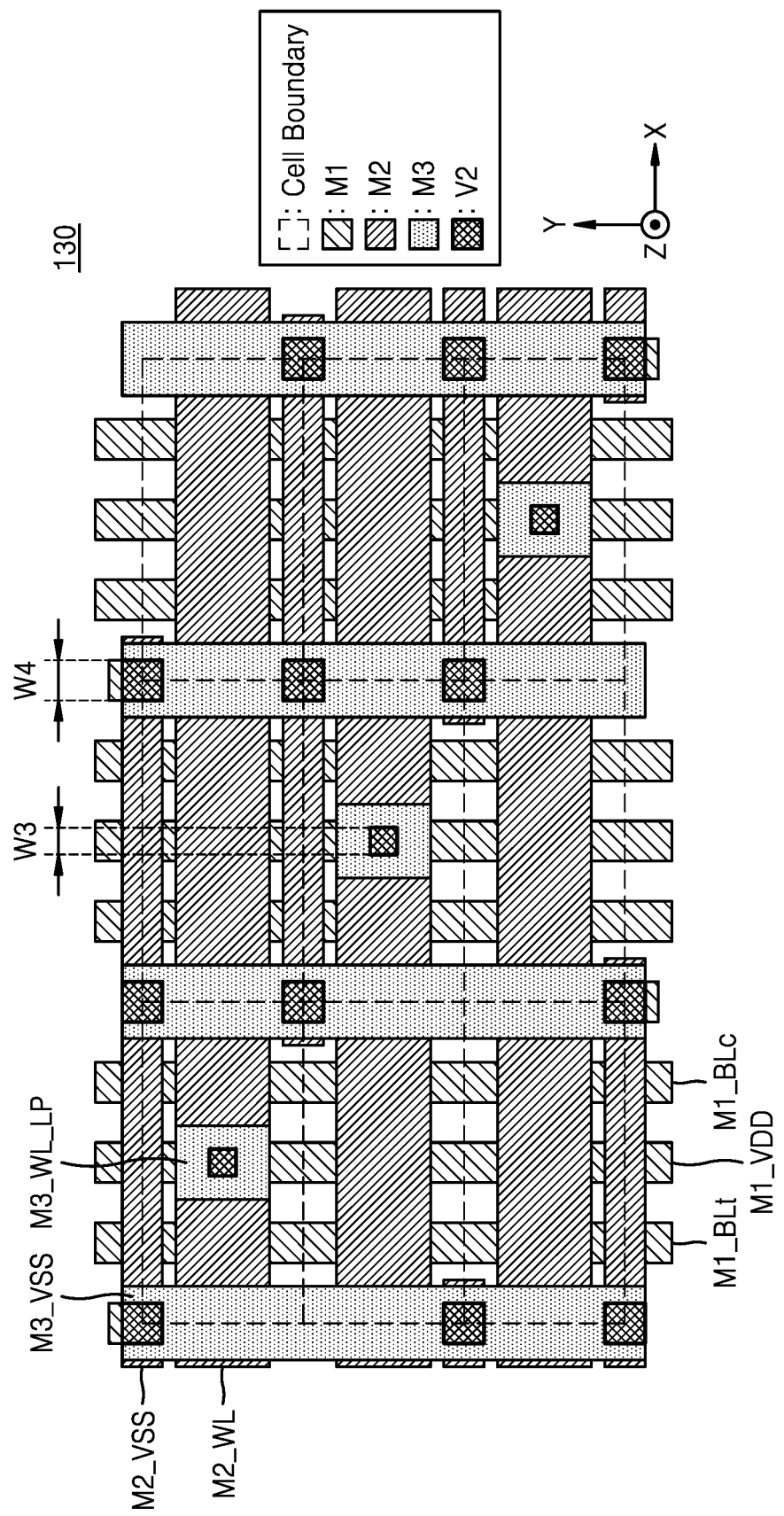
FIG. 13 is a plan view illustrating a wiring layer of a memory cell array according to an example embodiment.

FIG. 13 is a plan view illustrating a wiring layer of the memory cell array 130 according to an example embodiment. In detail, FIG. 13 is a plan view illustrating the second via layer V2 and the third wiring layer M3 formed on the memory cell array 130 on an X-Y plane, and descriptions with reference to FIG. 13 may be applied to any via layer and wiring layer that are successively stacked.

Referring to FIG. 13, as in FIG. 9, the second negative voltage pattern M3_VSS and the second word line landing pad M3_WL_LP may be formed on the third wiring layer M3. The second negative voltage pattern M3_VSS and the plurality of second word line landing pads M3_WL_LP may extend in the Y-axis direction (e.g., first direction). The second negative voltage pattern M3_VSS may be formed on the boundary of a memory cell. The plurality of second negative voltage patterns M3_VSS and the plurality of second word line landing pads M3_WL_LP may be alternately arranged to be parallel to one another in the X-axis direction.

Referring to FIG. 13, the second negative voltage pattern M3_VSS may be connected to the first negative voltage pattern M2_VSS formed on the second wiring layer M2 through vias formed in the second via layer V2. In addition, the second word line landing pad M3_WL_LP may be connected to the first word line pattern M2_WL formed on the second wiring layer M2 through a via formed in the first via layer V1.

According to an example embodiment, a width W4 of a via connected to the second negative voltage pattern M3_VSS may be greater than a width W3 of a via connected to the second word line landing pad M3_WL_LP. Alternatively, the cross-sectional area of the via connected to the second negative voltage pattern M3_VSS may be greater than the cross-sectional area of the via connected to the second word line landing pattern M2_WL. As the cross-sectional area of the via connected to the second negative voltage pattern M3_VSS increases, the resistance of a path through which the negative supply voltage VSS is transmitted to a memory cell may be reduced, and the driving characteristics of the negative supply voltage VSS may be improved.

Figure 14A:
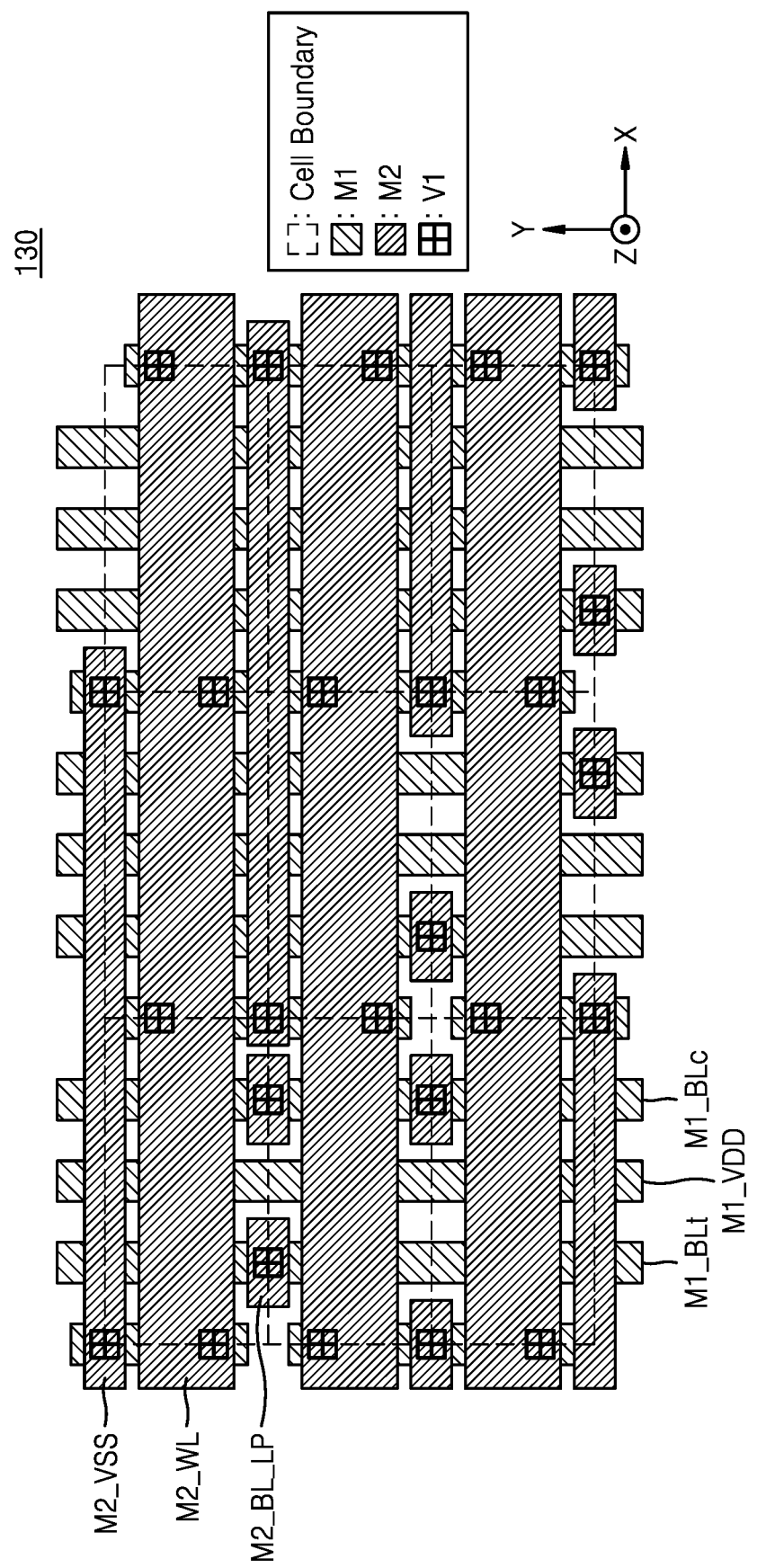
FIG. 14A is a plan view illustrating a wiring layer of a memory cell array according to an example embodiment.

FIG. 14A is a plan view illustrating a wiring layer of the memory cell array 130 according to an example embodiment. In detail, FIG. 14A is a plan view illustrating the first via layer V1 and the second wiring layer M2 formed on the memory cell array 130 on an X-Y plane, and descriptions with reference to FIG. 14A may be applied to any via layer and wiring layer that are successively stacked.

Referring to FIG. 14A, unlike FIG. 8B, a bit line landing pad M2_BL_LP may be formed on the second wiring layer M2. The bit line landing pad M2_BL_LP may be arranged in the cut region CR of FIG. 8B. The bit line landing pad M2_BL_LP may be connected to the first bit line pattern M1_BLt and the first complementary bit line pattern M1_BLc formed on the first wiring layer M1 through a via formed in the first via layer V1.

The bit line landing pad M2_BL_LP may be connected to a second bit line pattern M3_BLt and a second complementary bit line pattern M3_BLc, which will be described below with reference to FIG. 14B. Because the resistance of a path providing a voltage to a bit line through the bit line landing pad M2_BL_LP may be reduced, the driving characteristics of the bit line may be improved.

Figure 14B:
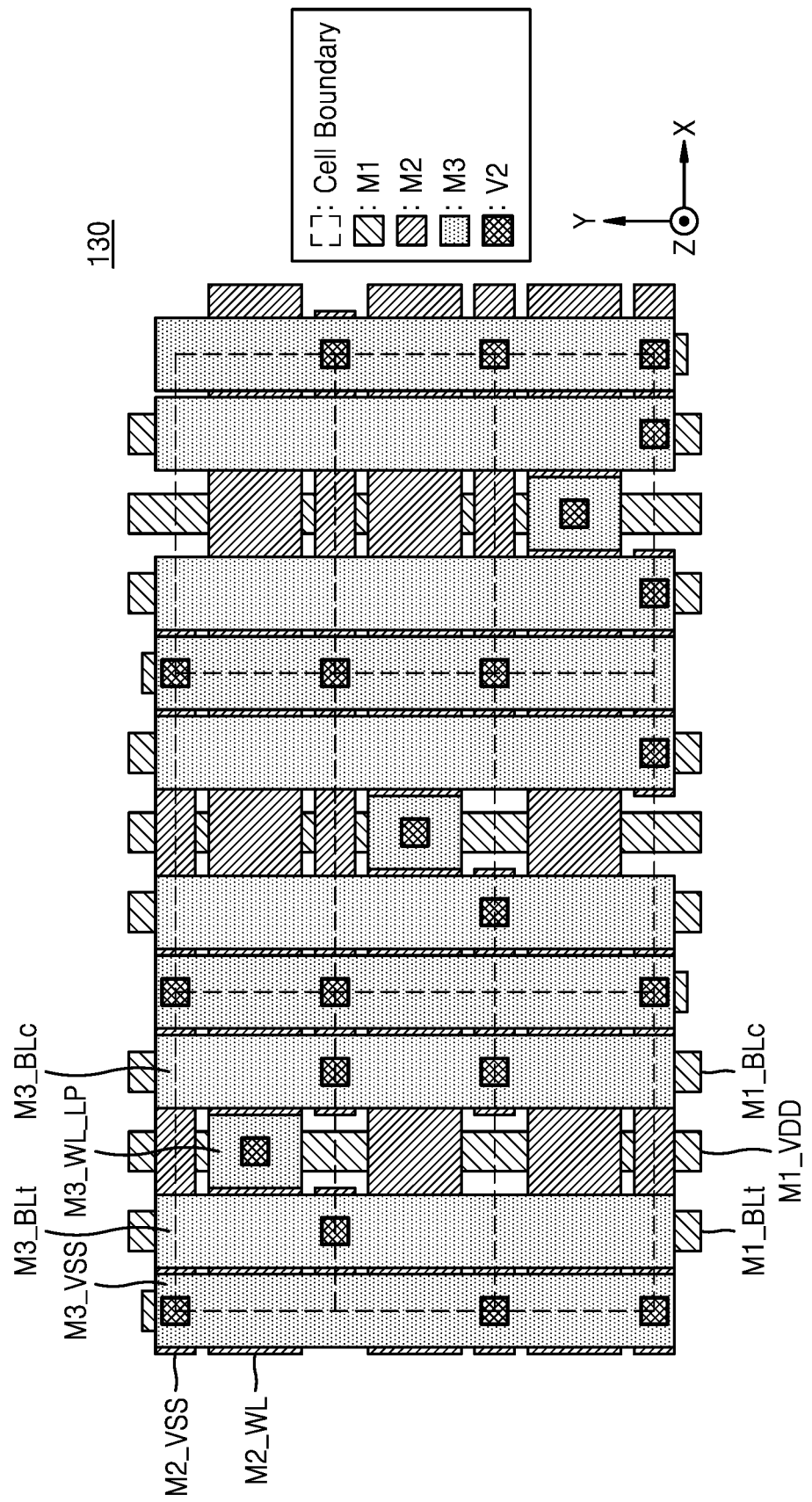
FIG. 14B is a plan view illustrating a wiring layer of a memory cell array according to an example embodiment.

FIG. 14B is a plan view illustrating a wiring layer of the memory cell array 130 according to an example embodiment. In detail, FIG. 14B is a plan view illustrating the second via layer V2 and the third wiring layer M3 formed on the memory cell array 130 on an X-Y plane, and descriptions with reference to FIG. 14B may be applied to any via layer and wiring layer that are successively stacked.

Referring to FIG. 14B, unlike FIG. 9, the second bit line pattern M3_BLt and the second complementary bit line pattern M3_BLc may be formed on the third wiring layer M3. The second bit line pattern M3_BLt may be arranged to overlap the first bit line pattern M1_BLt formed on the first wiring layer M1, and the second complementary bit line pattern M3_BLc may be arranged to overlap the first complementary bit line pattern M1_BLc formed on the first wiring layer M1.

Referring to FIGS. 14A and 14B, the second bit line pattern M3_BLt and the second complementary bit line pattern M3_BLc may be connected to the bit line landing pad M2_BL_LP formed on the second wiring layer M2 through vias formed in the second via layer V2.

Because the resistance of a path providing a voltage to a bit line may be reduced by forming the second bit line pattern M3_BLt and the second complementary bit line pattern M3_BLc on the third wiring layer M3, the driving characteristics of the bit line may be improved.

Figure 15:
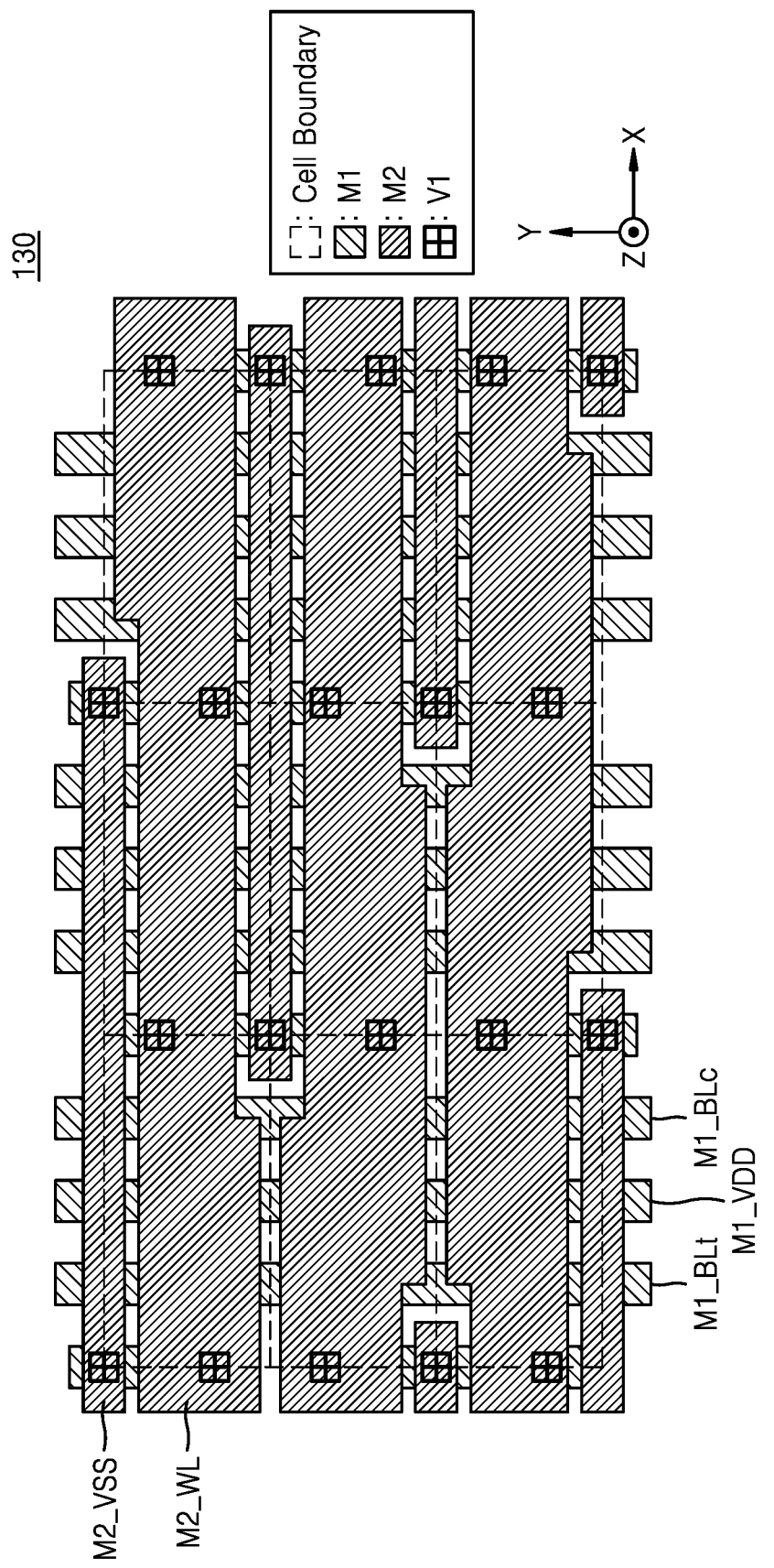
FIG. 15 is a plan view illustrating a wiring layer of a memory cell array according to an example embodiment.

FIG. 15 is a plan view illustrating a wiring layer of the memory cell array 130 according to an example embodiment. In detail, FIG. 15 is a plan view illustrating the first via layer V1 and the second wiring layer M2 formed on the memory cell array 130 on an X-Y plane, and descriptions with reference to FIG. 15 may be applied to any via layer and wiring layer that are successively stacked.

Referring to FIG. 15, as in FIG. 8B, the first negative voltage pattern M2_VSS and the first word line pattern M2_WL may be formed on the second wiring layer M2. However, unlike FIG. 8B, the first word line pattern M2_WL may have a jog pattern. In detail, the width of the first word line pattern M2_WL may be extended to a space occupied by the cut region CR of FIG. 8B. That is, a width of a portion of the first word line pattern M2_WL, the portion not being adjacent to the first negative voltage pattern M2_VSS, may be greater than a width of another portion of the first word line pattern M2_WL, the other portion being adjacent to the first negative voltage pattern M2_VSS. Accordingly, because the area of the first word line pattern M2_WL is increased, the resistance of a path through which a voltage is supplied to a word line may be reduced, and the driving characteristics of the word line may be improved.

Figure 16:
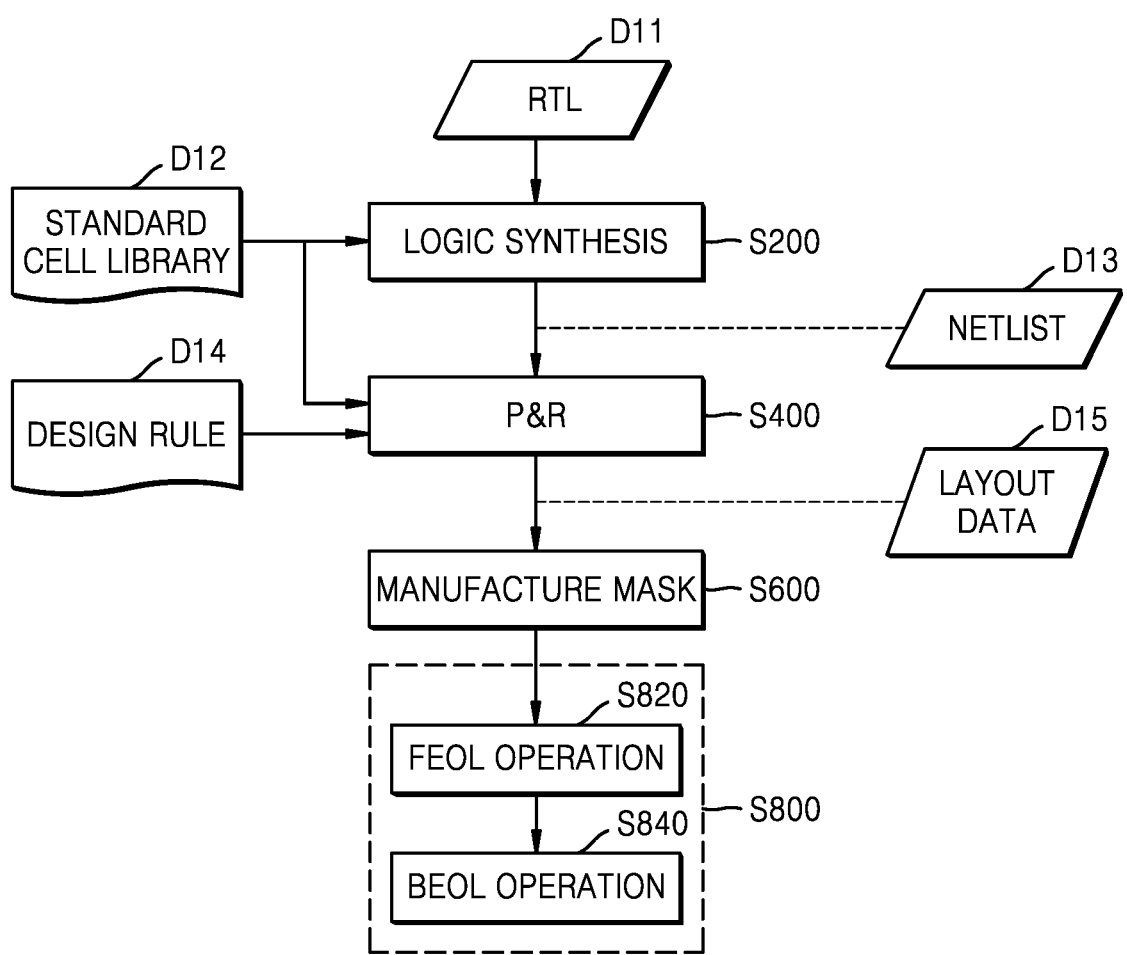
FIG. 16 is a flowchart illustrating a method of manufacturing an integrated circuit, according to an example embodiment.

FIG. 16 is a flowchart of a method of manufacturing an integrated circuit, according to an example embodiment. In some embodiments, at least some of operations S200, S400, S600, and S800 shown in FIG. 16 may be performed in a computing system (e.g., 300 of FIG. 20).

In operation S200, a logic synthesis of generating netlist data D13 from register-transfer level (RTL) data D11 by referring to a standard cell library D12 may be performed. The RTL data D11 may define a function of an integrated circuit, and as non-limiting examples, may be written as a Hardware Description Language (HDL) such as a VHSIC Hardware Description Language (VHDL) and Verilog. The standard cell library D12 may define functions and properties of standard cells. A semiconductor design tool (e.g., a logic synthesis tool) may perform logic synthesis from the RTL data D11 by referring to the standard cell library D12, and thus generate the netlist data D13 including a bitstream and/or a netlist defining an integrated circuit, that is, defining a plurality of standard cells and a connection relationship of the standard cells.

In operation S400, place and routing (P&R) of generating layout data D15 from the netlist data D13 by referring to the standard cell library D12 and a design rule D14 may be performed. The standard cell library D12 may define the layout of the standard cells, and the design rule D14 may define rules to be followed by the layout of an integrated circuit according to a semiconductor operation (e.g., operation S800). For example, the design rule D14 may define a minimum interval between patterns in a wiring layer, a width of a pattern in the wiring layer, a width of a via in a via layer, or the like.

The semiconductor design tool (e.g., a P&R tool) may arrange the plurality of standard cells by referring to the standard cell library D12 from the netlist data D13, and may route input pins, output pins, and power taps of the plurality of standard cells arranged by referring to the design rule D14.

The semiconductor design tool may generate wiring layers and via layers to improve driving characteristics. In some embodiments, as described above with reference to FIG. 8B, vias of the first via layer V1 connected to adjacent memory cells are connected to each other through the first negative voltage pattern M2_VSS formed on the second wiring layer M2, thereby improving driving characteristics for a negative supply voltage. As described above with reference to FIG. 9, the negative supply voltage VSS may be stably supplied throughout the memory cell array 130 through a mesh-shaped structure by connecting the first negative voltage pattern M2_VSS to the second negative voltage pattern M3_VSS. In some embodiments, as described above with reference to FIG. 10, driving characteristics for a word line may be improved by only arranging the plurality of second word line patterns M4_WL on the fourth wiring layer M4. In some embodiments, as described above with reference to FIGS. 11A and 11B, driving characteristics for a negative supply voltage may be improved by forming the mesh-shaped second negative voltage pattern M3_VSS MESH on the third wiring layer M3. In some embodiments, as described above with reference to FIGS. 12 and 13, driving characteristics for a negative supply voltage may be improved by expanding a width of vias on a path providing the negative supply voltage VSS. In some embodiments, as described above with reference to FIGS. 14A and 14B, driving characteristics of a bit line may be improved by arranging the bit line landing pad M2_BL_LP on the second wiring layer M2 and arranging the plurality of second bit line patterns M3_BLt_1 and M3_BLc 1 on the third wiring layer M3. In some embodiments, as described above with reference to FIG. 15, driving characteristics of a word line may be improved by expanding a width of the second word line pattern M2_WL to a cut region for the first negative voltage pattern M2_VSS.

In operation S600, an operation of manufacturing a mask may be performed. For example, as optical proximity correction (OPC) is applied to the layout data D15, patterns formed on a mask may be defined to form patterns formed on a plurality of layers, and at least one mask (or a photomask) for forming patterns of each of the plurality of layers may be manufactured.

In operation S800, an operation of fabricating the integrated circuit may be performed. For example, the integrated circuit may be fabricated by patterning the plurality of layers by using the at least one mask manufactured in operation S600. As shown in FIG. 16, operation S800 may include operations S820 and S840.

In operation S820, a front-end-of-line (FEOL) operation may be performed. The FEOL operation may refer to an operation of forming individual devices, for example, a transistor, a capacitor, a resistor, or the like, on a substrate during the fabrication of the integrated circuit. For example, the FEOL operation may include planarizing and cleaning a wafer, forming a trench, forming a well, forming a gate line, and forming a source and a drain. Accordingly, devices included in the plurality of standard cells may be formed.

In operation S840, a back-end-of-line (BEOL) operation may be performed. The BEOL operation may refer to an operation of interconnecting the individual devices, for example, the transistor, the capacitor, the resistor, and the like, during the fabrication of the integrated circuit. For example, the BEOL operation may include performing silicidation on gate, source, and drain regions, adding a dielectric material, planarizing, forming a hole, adding a metal layer, forming a via, and forming a passivation layer. The wiring layers and via layers described above with reference to FIGS. 3 to 15 may be formed in the BEOL operation S840. Next, the integrated circuit may be packaged in a semiconductor package and used as a component of various applications.

Figure 17:
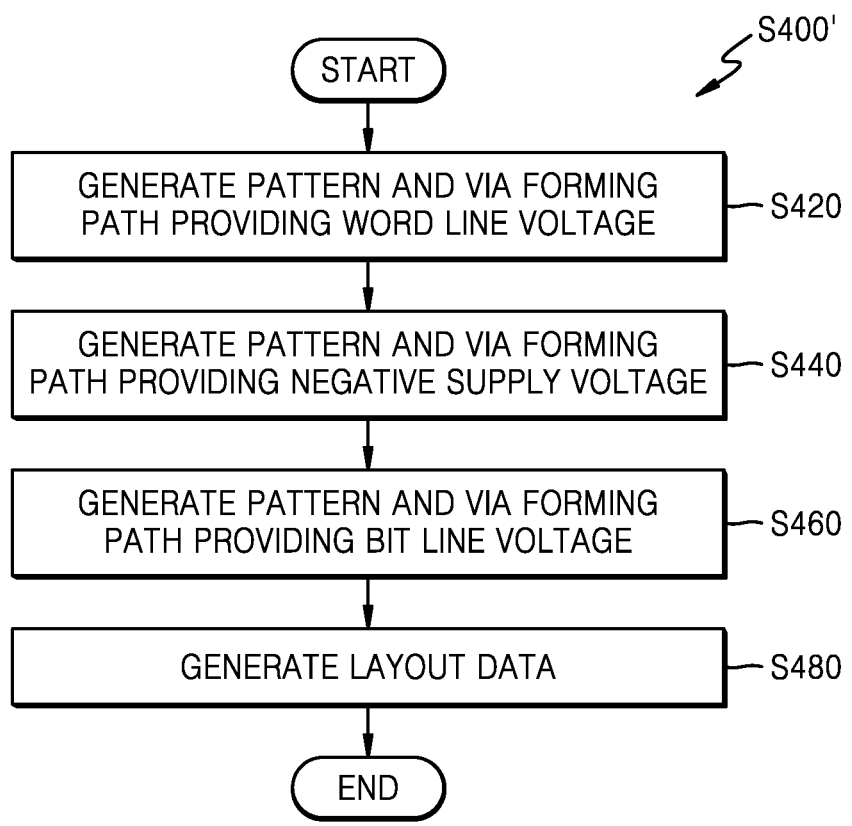
FIG. 17 is a flowchart showing an example of operation S400 of FIG. 16, according to an example embodiment.

FIG. 17 is a flowchart showing an example of operation S400 of FIG. 16, according to an example embodiment. As described above with reference to FIG. 16, in operation S400' of FIG. 17, arrangement and routing may be performed by referring to the standard cell library D12 and the design rule D14. As shown in FIG. 17, operation S400' may include a plurality of operations S420, S440, S460, and S480. Hereinafter, descriptions of FIG. 17 will be made with reference to FIG. 16. The plurality of operations S420, S440, S460, and S480 may be operations of generating paths for providing a word line voltage, supply voltages VDD and VSS, and a bit line voltage to the plurality of standard cells after the plurality of standard cells are arranged.

In operation S420, conductive patterns and vias forming a path providing a word line voltage may be generated. For example, the first word line landing pad M1_WL_LP1 formed on the first wiring layer M1 described above with reference to FIG. 7, the first word line pattern M2_WL formed on the second wiring layer M2 described above with reference to FIGS. 8A and 8B, the second word line landing pattern M3_WL_LP formed on the third wiring layer M3 described above with reference to FIG. 9, and the second word line pattern M4_WL formed on the fourth wiring layer M4 described above with reference to FIG. 10 may be generated. Vias of the first to third via layers V1, V2, and V3 described above through FIGS. 2 to 15 may also be generated.

In operation S440, patterns and vias forming a path providing the negative supply voltage VSS may be generated. For example, the first negative voltage landing pad M1_VSS_LP formed on the first wiring layer M1 described above with reference to FIG. 7, the second negative voltage landing pad M2_VSS_LP formed on the second wiring layer M2 described with reference to FIG. 8A, the first negative voltage pattern M2_VSS formed on the second wiring layer M2 described above with reference to FIG. 8B, the second negative voltage pattern M3_VSS formed on the third wiring layer M3 described above with reference to FIG. 9, and the meshed-shaped second negative voltage pattern M3_VSS Mesh described above with reference to FIGS. 11A and 11B may be generated. Vias of the first to third via layers V1, V2, and V3 described above through FIGS. 2 to 15 may also be generated.

In operation of S460, patterns and vias forming a path providing a bit line voltage may be generated. For example, the first bit line pattern M1_BLt and the first complementary bit line pattern M1_BLc formed on the first wiring layer M1 described above with reference to FIG. 7, the bit line landing pad M2_BL_LP formed on the second wiring layer M2 described above with reference to FIG. 14A, and the second bit line pattern M3_BLt and the second complementary bit line pattern M3_BLc formed on the third wiring layer M3 described above with reference to FIG. 14B may be generated. Vias of the first to third via layers V1, V2, and V3 described above through FIGS. 2 to 15 may also be generated.

In operation S480, an operation of generating layout data may be performed. As described above with reference to FIG. 16, the layout data D15 may define the layout of an integrated circuit, may have a format such as GDSII, and may include geometric information of the plurality of standard cells and interconnections thereof.

Figure 18:
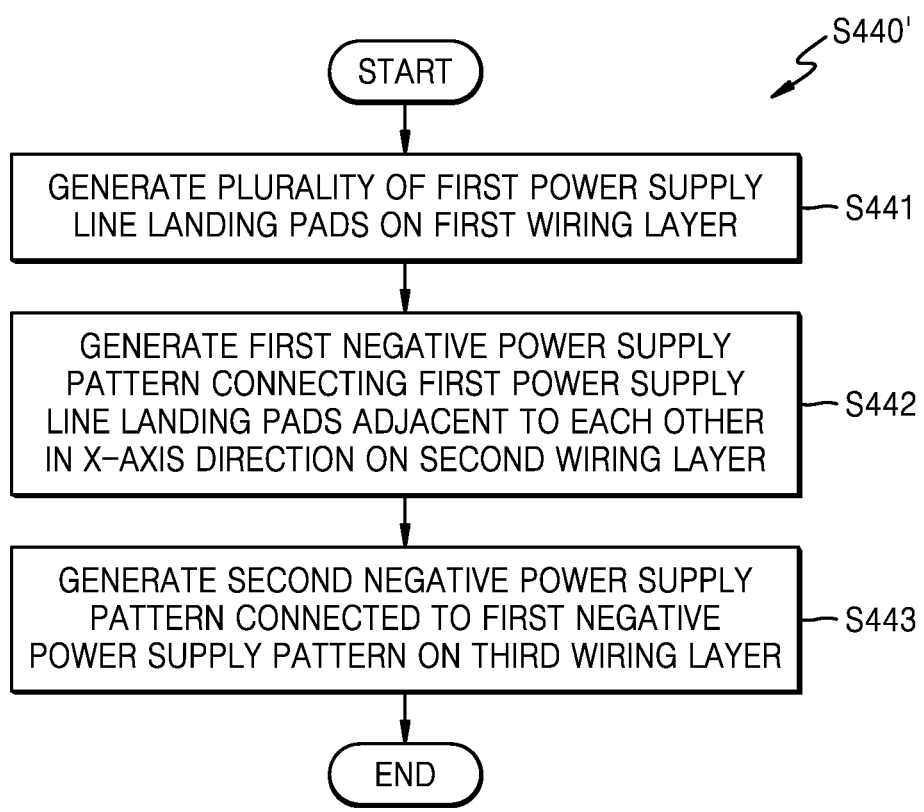
FIG. 18 is a flowchart showing an example of operation S440 of FIG. 17, according to an example embodiment.

FIG. 18 is a flowchart showing an example of operation S440 of FIG. 17, according to an example embodiment.

Referring to FIG. 18, a path for providing a negative supply voltage may be generated through a plurality of operations S441 to S443.

In operation S441, a plurality of first power supply line landing pads may be generated on a first wiring layer. As described above with reference to FIG. 10, each of the plurality of first power supply line landing pads may be arranged at a corner of a boundary of a memory cell.

In operation S442, a first negative power supply pattern connecting the plurality of first power supply line landing pads adjacent to each other in an X-axis direction to each other may be generated on a second wiring layer. Through the first negative power supply pattern, adjacent SRAM cells may receive the negative supply voltage VSS through a common path. Accordingly, the SRAM cells may stable receive the negative supply voltage VSS.

In operation S443, a second negative power supply pattern connected to the first negative power supply patterns may be generated on a third wiring layer. In some embodiments, as described above with reference to FIG. 9, the second negative power supply pattern may have a line shape extending in a Y-axis direction. In some embodiments, as described above with reference to FIGS. 11A and 11B, the second negative power supply pattern may have a mesh shape. A mesh-shaped path providing the negative supply voltage VSS may be formed by connecting the second negative power supply pattern to the first negative power supply pattern. Accordingly, the SRAM cells may stable receive the negative supply voltage VSS.

Figure 19:
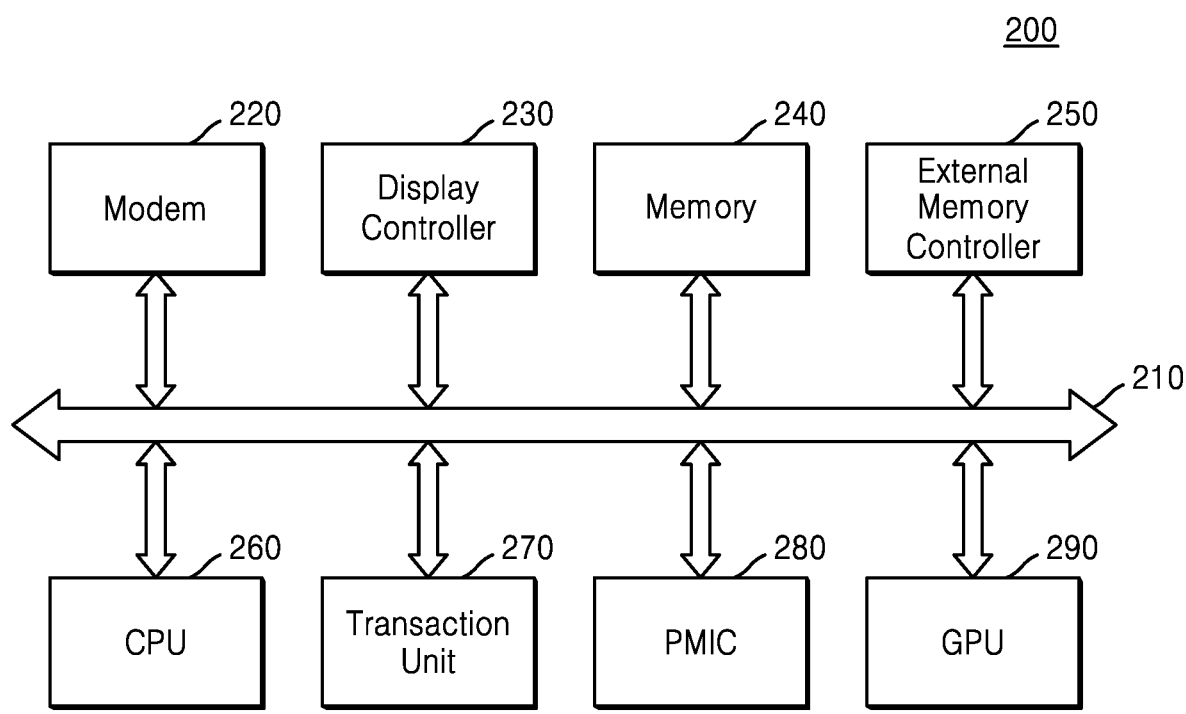
FIG. 19 is a block diagram of a system-on-chip (SoC) according to an example embodiment.

FIG. 19 is a block diagram of a system-on-chip (SoC) 200 according to an example embodiment. The SoC 200 is a semiconductor device, and may include an integrated circuit including patterns and vias for improving driving characteristics according to an example embodiment. The SoC 200 is obtained by implementing complex functional blocks, such as intellectual property (IP) performing various functions on one chip. A memory cell according to an example embodiment, for example, an SRAM cell, may be included in each functional block of the SoC 200 and accordingly, the SoC 200 having improved driving characteristics for a word line voltage, a bit line voltage, and a power supply voltage, or the like may be achieved.

Referring to FIG. 19, the SoC 200 may include a modem 220, a display controller 230, a memory 240, an external memory controller 250, a central processing unit (CPU) 260, a transaction unit 270, a power management integrated circuit (PMIC) 280, and a graphics processing unit (GPU) 290, and the functional blocks of the SoC 200 may communicate with each other through a system bus 210.

The CPU 260, which may control the overall operation of the SoC 200, may control operations of other functional blocks of the SoC 200. The modem 220 may demodulate a signal received from outside the SoC 200 or may demodulate a signal generated inside the SoC 200 and transmit the signal to the outside. The external memory controller 250 may control an operation of transmitting or receiving data to or from an external memory device connected to the SoC 200. For example, a program and/or data stored in the external memory device may be provided to the CPU 260 or the GPU 290 under control by the external memory controller 250. The GPU 290 may execute program instructions related to graphics processing. The GPU 290 may receive graphics data via the external memory controller 250 or transmit graphics data processed by the GPU 290 to the outside the SoC 200 via the external memory controller 250. The transaction unit 270 may monitor data transaction of the functional blocks, and the PMIC 280 may control power supplied to each functional block under control by the transaction unit 270. The display controller 230 may transmit data generated in the SoC 200 to a display outside the SoC 200 by controlling the display (or display apparatus).

The memory 240 may include a non-volatile memory such as electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), or ferroelectric random access memory (FRAM), and may include a volatile memory such as dynamic random access memory (DRAM), static random access memory (SRAM), mobile DRAM, double data rate synchronous dynamic random access memory (DDR SDRAM), low power DDR (LPDDR) SDRAM, graphic DDR (GDDR) SDRAM, or Rambus dynamic random access memory (RDRAM).

Figure 20:
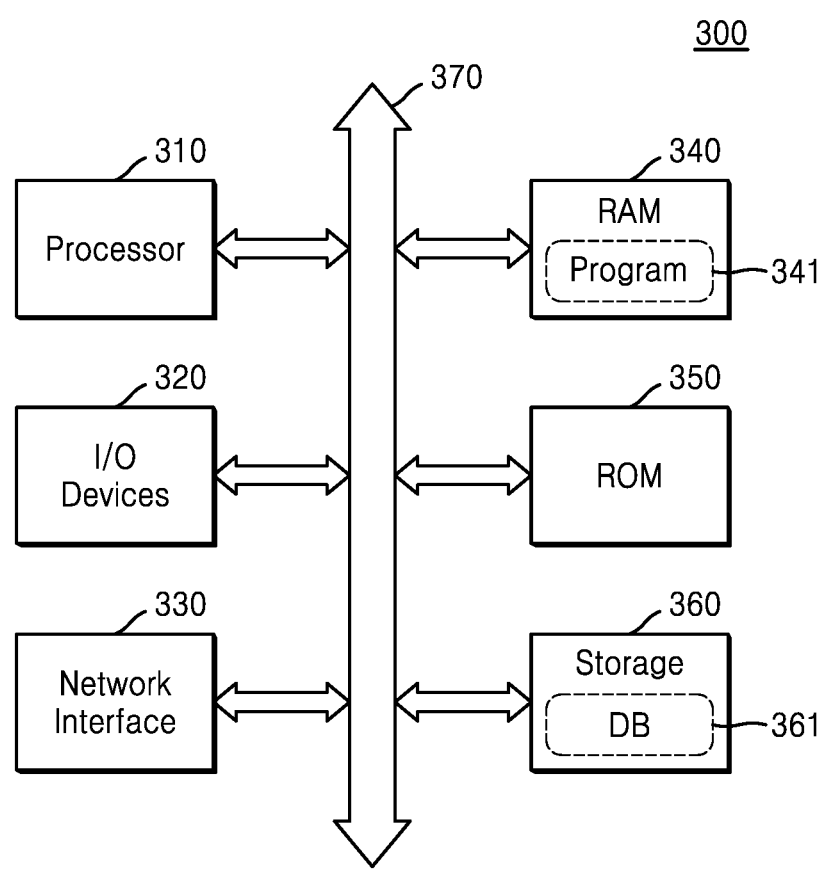
FIG. 20 is a block diagram of a computing system including a memory storing a program, according to an example embodiment.

FIG. 20 is a block diagram of a computing system 300 including a memory storing a program, according to an example embodiment. According to an example embodiment, at least some of operations included in a method of manufacturing an integrated circuit (e.g., the method shown in FIG. 16) may be performed in the computing system 300.

The computing system 300 may be a fixed computing system such as a desktop computer, a workstation, or a server, or may be a portable computing system such as a laptop computer. As shown in FIG. 20, the computing system 300 may include a processor 310, input/output (I/O) devices 320, a network interface 330, random access memory (RAM) 340, read only memory (ROM) 350, and a storage 360. The processor 310, the I/O devices 320, the network interface 330, the RAM 340, the ROM 350, and the storage 360 may be connected to a bus 370 and communicate with each other through the bus 370.

The processor 310 may be referred to as a processing unit, and may include at least one core capable of executing an arbitrary instruction set (for example, Intel architecture-32 (IA-32), 64-bit extended IA-32, x86-64, PowerPC, Sparc, MIPS, ARM, or IA-64), such as a microprocessor, an application processor (AP), a digital signal processor (DSP), or a GPU. For example, the processor 310 may access a memory, i.e., the RAM 340 or ROM 350, via the bus 370, and execute instructions stored in the RAM 340 or ROM 350.

The RAM 340 may store a program 341 or at least a portion thereof for manufacturing an integrated circuit according to an example embodiment, and the program 341 may cause the processor 310 to perform at least some of operations included in a method of manufacturing an integrated circuit. That is, the program 341 may include a plurality of instructions executable by the processor 310, and the plurality of instructions included in the program 341 may cause the processor 310 to perform, for example, a logic synthesis operation of operation S200 and/or an arrangement and routing operation of operation of operation S400 of FIG. 16.

The storage 360 may not lose stored data even when power supplied to the computing system 300 is cut off. For example, the storage 360 may include a non-volatile memory device or may include a storage medium such as a magnetic tape, an optical disk, or a magnetic disk. Also, the storage 360 may be detached from the computing system 300. In some embodiments, the storage device 360 may store the program 341 according to an example embodiment, and the program 341 or at least a portion thereof may be loaded into the RAM 340 from the storage device 360 before the program 341 is executed by the processor 310. In some embodiments, the storage 360 may store a file prepared in a program language, and the program 341 generated by a compiler or the like or at least a portion of the program 341 may be loaded to the RAM 340 from the file. Also, as shown in FIG. 20, the storage 360 may store a database 361, and the database 361 may include information required to design an integrated circuit, for example, the standard cell library D12, the design rule D14, or the like of FIG. 16.

The storage 360 may store data processed or to be processed by the processor 310. In other words, according to the program 341, the processor 310 may generate data by processing data stored in the storage 360 or may store generated data in the storage 360. For example, the storage 360 may store the RTL data D11, the netlist data D13, and/or the layout data D15 of FIG. 16.

The I/O devices 320 may include an input device such as a keyboard, a pointing device, or the like, and may include an output device such as a display device, a printer, or the like. For example, via the I/O devices 320, a user may trigger execution of the program 341 by the processor 310, input the RTL data D11 and/or the netlist data D13 of FIG. 16, or identify the layout data D15 of FIG. 16.

The network interface 330 may provide an access to a network outside the computing system 300. For example, the network may include a plurality of computing systems and communication links, and the communication links may include wired links, optical links, wireless links, or other types of links.

While the inventive concept has been particularly shown and described with reference to embodiments thereof, it will be understood that various changes in form and details may be made therein without departing from the spirit and scope of the following claims.

What is claimed is:

1. An integrated circuit comprising a plurality memory cells, the integrated circuit comprising:
   a first wiring layer comprising:
      a first bit line pattern and a positive power supply pattern extending in a first direction, the positive power supply pattern being configured to provide a positive supply voltage; and
      a plurality of first power supply line landing pads configured to provide a negative supply voltage, and a plurality of first word line landing pads configured to provide a word line voltage;
   a second wiring layer comprising:
      a first negative power supply pattern extending in a second direction, and connecting first power supply line landing pads, which are adjacent to each other in the second direction among the plurality of first power supply line landing pads, to each other, and configured to provide the negative supply voltage; and
      a plurality of first word line patterns extending in the second direction, connected to the plurality of first word line landing pads, and configured to provide the word line voltage;
   a third wiring layer comprising:
      a second negative power supply pattern connected to the first negative power supply pattern; and
      a plurality of second word line landing pads connected to the plurality of first word line patterns; and
   a fourth wiring layer comprising:
      a plurality of second word line patterns extending in the second direction, connected to the plurality of second word line landing pads, and configured to provide the word line voltage.

2. The integrated circuit of claim 1, wherein the second negative power supply pattern on the third wiring layer extends in the first direction.

3. The integrated circuit of claim 1, wherein the second negative power supply pattern is formed in a mesh pattern on the third wiring layer.

4. The integrated circuit of claim 1, further comprising a first via layer which comprises:
   at least one first via extending in a third direction, and connecting at least one of the first power supply line landing pads, which are adjacent to each other in the second direction among the plurality of first power supply line landing pads, to the first negative power supply pattern; and
   at least one second via extending in the third direction and connecting the plurality of first word line landing pads to the plurality of first word line patterns.

5. The integrated circuit of claim 4, wherein a cross-sectional area of the first via is greater than a cross-sectional area of the second via.

6. The integrated circuit of claim 4, further comprising a second via layer which comprises:
   at least one third via extending in the third direction, and connecting the first negative power supply pattern to the second negative power supply pattern; and
   a fourth via extending in the third direction, and connecting at least one of the plurality of first word line patterns to at least one the plurality of second word line landing pads.

7. The integrated circuit of claim 6, wherein a cross-sectional area of the third via is greater than a cross-sectional area of the fourth via.

8. The integrated circuit of claim 1, wherein a width of a portion of at least one of the plurality of first word line patterns, the portion being adjacent to the first negative power supply pattern, is less than a width of another portion of the at least one of the plurality of first word line patterns, the other portion not being adjacent to the first negative power supply pattern.

9. The integrated circuit of claim 1, wherein the second wiring layer further comprises a bit line landing pad formed on the second wiring layer, and connected to the first bit line pattern.

10. The integrated circuit of claim 9, wherein the third wiring layer further comprises a second bit line pattern formed on the third wiring layer, connected to the bit line landing pad, and extending in the first direction.

11. The integrated circuit of claim 1, wherein the plurality of second word line patterns are arranged to be adjacent to each other on the fourth wiring layer.

12. The integrated circuit of claim 1, wherein the memory cells comprise a static random access memory (SRAM) cell in a six-transistors (6T) structure.

13. An integrated circuit comprising a plurality memory cells, the integrated circuit comprising:
- a bit line structure comprising:
  - a first bit line pattern formed on a first wiring layer, configured to provide a bit line voltage to the memory cells, and extending in a first direction;
- a word line structure comprising:
  - a plurality of first word line landing pads formed on the first wiring layer, and configured to provide a word line voltage to the memory cells;
  - a plurality of first word line patterns formed on a second wiring layer, extending in a second direction perpendicular to the first direction, and connected to the plurality of first word line landing pads;
  - a plurality of second word line landing pads formed on a third wiring layer and connected to the plurality of first word line patterns; and
  - a plurality of second word line patterns formed on a fourth wiring layer, extending in the second direction, and connected to the plurality of second word line landing pads; and
- a negative power supply line structure comprising:
  - a plurality of first power supply line landing pads formed on the first wiring layer, and configured to provide a negative supply voltage to the memory cells;
  - a first negative power supply pattern formed on the second wiring layer, extending in the second direction, and connecting first power supply line landing pads, which are adjacent to each other in the second direction among the plurality of first power supply line landing pads, to each other; and
  - a second negative power supply pattern formed on the third wiring layer and connected to the first negative power supply pattern.

14. The integrated circuit of claim 13, wherein the second negative power supply pattern on the third wiring layer extends in the first direction.

15. The integrated circuit of claim 13, the second negative power supply pattern is formed in a mesh pattern on the third wiring layer.

16. An integrated circuit comprising a plurality memory cells, the integrated circuit comprising:
- a bit line structure and a word line structure; and
- a negative power supply line structure comprising:
  - a plurality of first power supply line landing pads formed on a first wiring layer, and configured to provide a negative supply voltage to the memory cells;
  - a first negative power supply pattern formed on a second wiring layer, and connecting first power supply line landing pads, which are adjacent to each other among the plurality of first power supply line landing pads, to each other; and
  - a second negative power supply pattern formed on a third wiring layer and connected to the first negative power supply pattern.

17. The integrated circuit of claim 16, wherein the word line structure comprises:
- a plurality of first word line landing pads formed on a first wiring layer, and configured to provide a word line voltage to the memory cells;
- a plurality of first word line patterns formed on the second wiring layer, and connected to the plurality of first word line landing pads;
- a plurality of second word line landing pads formed on the third wiring layer, and connected to the plurality of first word line patterns; and
- a plurality of second word line patterns formed on a fourth wiring layer, and connected to the plurality of second word line landing pads.

18. The integrated circuit of claim 17, wherein the fourth wiring layer does not include a bit line patter, a word line pattern, a positive power supply pattern, and a negative power supply pattern.

19. The integrated circuit of claim 16, wherein the second negative power supply pattern on the third wiring layer extends in a first direction, and
wherein the first negative power supply pattern formed on the second wiring layer extends in a second direction.

20. The integrated circuit of claim 16, wherein the bit line structure comprises:
- a first bit line pattern formed on a first wiring layer, configured to provide a bit line voltage to the memory cells, and extending in a first direction; and
- a second bit line pattern formed on the third wiring layer, and connected to a bit line landing pad, and extending in the first direction.

* * * * *